(12) United States Patent
Zhang et al.

(10) Patent No.: US 12,310,115 B2
(45) Date of Patent: May 20, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Bo Zhang, Beijing (CN); Zhongliu Yang, Beijing (CN); Tianyi Cheng, Beijing (CN); Benlian Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/548,497

(22) PCT Filed: Nov. 29, 2022

(86) PCT No.: PCT/CN2022/134914
§ 371 (c)(1),
(2) Date: Aug. 30, 2023

(87) PCT Pub. No.: WO2024/113139
PCT Pub. Date: Jun. 6, 2024

(65) Prior Publication Data
US 2025/0015094 A1    Jan. 9, 2025

(51) Int. Cl.
*G09G 3/3233*    (2016.01)
*H10D 86/40*    (2025.01)
*H10D 86/60*    (2025.01)

(52) U.S. Cl.
CPC ........... *H10D 86/60* (2025.01); *G09G 3/3233* (2013.01); *H10D 86/441* (2025.01);
(Continued)

(58) Field of Classification Search
CPC ............... G09G 2300/0426; G09G 3/3233
See application file for complete search history.

(56) References Cited

U.S. PATENT DOCUMENTS

2016/0240565 A1    8/2016   Kim et al.
2018/0033979 A1    2/2018   Jang et al.
(Continued)

FOREIGN PATENT DOCUMENTS

CN    109087610 A    12/2018
CN    208621887 U    3/2019
(Continued)

OTHER PUBLICATIONS

International Search Report & Written Opinion mailed Aug. 2, 2023, regarding PCT/CN2022/134914.

*Primary Examiner* — Kevin M Nguyen
(74) *Attorney, Agent, or Firm* — Intellectual Valley Law, P.C.

(57) ABSTRACT

An array substrate is provided. The array substrate includes a plurality of pixel driving circuits. A respective pixel driving circuit of the plurality of pixel driving circuit includes a driving transistor, a compensating transistor, and a first reset transistor. An active layer of the driving transistor is in a first semiconductor material layer. Active layers of the compensating transistor and the first reset transistor are in a second semiconductor material layer different from the first semiconductor material layer. The array substrate includes a third connecting line in a first signal line layer, and connected to a second electrode of the compensating transistor. The third connecting line crosses over at least two control signal lines.

20 Claims, 35 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01); *G09G 2310/08* (2013.01)

(56) References Cited

U.S. PATENT DOCUMENTS

| | | | |
|---|---|---|---|
| 2020/0274093 | A1 | 8/2020 | Eom et al. |
| 2020/0371401 | A1 | 11/2020 | Kitagawa et al. |
| 2021/0043134 | A1 | 2/2021 | Cho et al. |
| 2021/0118361 | A1 | 4/2021 | Li |
| 2021/0134917 | A1 | 5/2021 | Li et al. |
| 2021/0167161 | A1 | 6/2021 | Yang et al. |
| 2021/0210474 | A1 * | 7/2021 | Ikeda ...................... G09G 3/32 |
| 2022/0310010 | A1 | 9/2022 | Cheng et al. |
| 2022/0319438 | A1 | 10/2022 | Sun et al. |
| 2023/0031984 | A1 | 2/2023 | Wang et al. |

FOREIGN PATENT DOCUMENTS

| | | | |
|---|---|---|---|
| CN | 110223640 | A | 9/2019 |
| CN | 111128080 | A | 5/2020 |
| CN | 111968574 | A | 11/2020 |
| CN | 112071860 | A | 12/2020 |
| CN | 112331139 | A | 2/2021 |
| CN | 113540126 | A | 10/2021 |
| CN | 113745253 | A | 12/2021 |
| CN | 113950715 | A | 1/2022 |
| CN | 114514573 | A | 5/2022 |

\* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/134914, filed Nov. 29, 2022, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of pixel driving circuits; wherein a respective pixel driving circuit of the plurality of pixel driving circuit comprises a driving transistor, a compensating transistor, and a first reset transistor; wherein an active layer of the driving transistor is in a first semiconductor material layer; active layers of the compensating transistor and the first reset transistor are in a second semiconductor material layer different from the first semiconductor material layer; the array substrate comprises a third connecting line in a first signal line layer, and connected to a second electrode of the compensating transistor; and the third connecting line crosses over at least two control signal lines.

Optionally, the third connecting line crosses over at least two control signal lines configured to transmit different types of control signals.

Optionally, the third connecting line crosses over at least two of a gate line, a reset control signal line, and a light emitting control signal line.

Optionally, the third connecting line crosses over a gate line, a reset control signal line, and a light emitting control signal line.

Optionally, the third connecting line crosses over a respective first gate line; a respective first reset control signal line; a respective second reset control signal line; a respective first reset signal line; a respective second reset signal line; and a respective second light emitting control signal line.

Optionally, the respective pixel driving circuit further comprises a second reset transistor and a light emitting control transistor; and the third connecting line is further connected to a second electrode of the second reset transistor and a first electrode of the light emitting control transistor.

Optionally, the third connecting line crosses over a respective second reset control signal line and a respective second reset signal line; and an orthographic projection of the respective second reset control signal line on a base substrate at least partially overlaps with an orthographic projection of the respective second reset signal line on the base substrate.

Optionally, the third connecting line crosses over a respective first reset control signal line; the respective first reset control signal line comprises a respective first reset control signal line first branch and a respective first reset control signal line second branch; and an orthographic projection of the respective first reset control signal line first branch on a base substrate at least partially overlaps with an orthographic projection of the respective first reset control signal line second branch on the base substrate.

Optionally, the third connecting line crosses over a respective first reset signal line; the respective first reset signal line comprises a plurality of first portions and a plurality of second portions alternately arranged and connected together; and the plurality of first portions are in a layer different from the plurality of second portions.

Optionally, the third connecting line crosses over a respective first reset signal line first portion of the plurality of first portions in a second gate metal layer.

Optionally, a respective first reset signal line second portion of the plurality of second portions is in the first signal line layer; the array substrate further comprises a second connecting line in the first signal line layer; the respective first reset signal line second portion comprises a first segment, a second segment, and a third segment curving around two adjacent second connecting lines of two adjacent pixel driving circuits; and the two adjacent second connecting lines are at least partially in an area surrounded by the third segment and a virtual straight line connecting the first segment and the second segment.

Optionally, the active layers, at least portions of first electrodes, and at least portions of second electrodes, of the compensating transistor and the first reset transistor are in the second semiconductor material layer; and the first electrode, the active layer, and the second electrode of the compensating transistor are arranged along a direction substantially parallel to a direction along which the first electrode, the active layer, and the second electrode of the first reset transistor are arranged.

Optionally, the array substrate further comprises a first connecting line in the first signal line layer; wherein the first connecting line is connected to a first electrode of the driving transistor and connected to a second electrode of a data write transistor; the first connecting line crosses over a respective second reset control signal line and a respective second reset signal line; and an orthographic projection of the respective second reset control signal line on a base substrate at least partially overlaps with an orthographic projection of the respective second reset signal line on the base substrate.

Optionally, the array substrate further comprises a voltage connecting pad and a respective voltage supply line connected to the voltage connecting pad; wherein the voltage connecting pad connects to first electrodes of third transistors of two adjacent pixel driving circuits.

Optionally, the array substrate further comprises a plurality of data lines; wherein two data lines of the plurality of data lines cross over the voltage connecting pad.

Optionally, the array substrate comprises a plurality of first light emitting control signal lines and a plurality of second light emitting control signal lines; wherein the respective pixel driving circuit further comprises a light emitting control transistor; a first electrode of the light emitting control transistor extends in a space between a respective second light emitting control signal line of the plurality of second light emitting control signal lines and a respective first light emitting control signal line in a next row of the plurality of first light emitting control signal lines; and an orthographic projection of the first electrode of the light emitting control transistor on a base substrate is non-overlapping with an orthographic projection of the respective first light emitting control signal line in the next row on the base substrate and non-overlapping with an orthographic projection of the respective second light emitting control signal line on the base substrate.

Optionally, the array substrate comprises a plurality of first light emitting control signal lines and a plurality of second light emitting control signal lines; wherein the respective pixel driving circuit further comprises a light emitting control transistor; an orthographic projection of an active layer of the light emitting control transistor on a base substrate at least partially overlaps with an orthographic projection of the third connecting line on the base substrate; and an orthographic projection of a first electrode of the light emitting control transistor on the base substrate at least partially overlaps with the orthographic projection of the third connecting line on the base substrate.

Optionally, the array substrate comprises a plurality of voltage supply lines; wherein an orthographic projection of the plurality of voltage supply lines on a base substrate covers an orthographic projection of at least an active layer of the compensating transistor and an active layer of the first reset transistor on the base substrate; an orthographic projection of a combination of a connecting bridge connecting two adjacent voltage supply lines of the plurality of voltage supply lines and the two adjacent voltage supply lines on a base substrate covers an orthographic projection of a portion of a respective second gate line on the base substrate, the portion of the respective second gate line being between gate electrodes of two compensating transistors respectively in two adjacent pixel driving circuits.

Optionally, the array substrate comprises a plurality of first reset control signal lines; wherein a respective first reset control signal lines of the plurality of first reset control signal lines comprises a respective first reset control signal line first branch and a respective first reset control signal line second branch; in a region where an orthographic projection of the third connecting line on a base substrate overlaps with an orthographic projection of the respective first reset control signal line on the base substrate, an orthographic projection of the respective first reset control signal line first branch on the base substrate and an orthographic projection of the respective first reset control signal line second branch on the base substrate partially overlap with each other, and are partially non-overlapping; in the region, a portion of the orthographic projection of the respective first reset control signal line first branch on the base substrate that is non-overlapping with the orthographic projection of the respective first reset control signal line second branch on the base substrate has a first width along an extension direction of the third connecting line; in the region, a portion of the orthographic projection of the respective first reset control signal line second branch on the base substrate that is non-overlapping with the orthographic projection of the respective first reset control signal line first branch on the base substrate has a second width along an extension direction of the third connecting line; in the region, an orthographic projection of a combination of the respective first reset control signal line first branch and the respective first reset control signal line second branch on the base substrate has a third width along the extension direction of the third connecting line; and a sum of the first width and the second width is greater than 40% of the third width.

Optionally, corresponding layers of a first pixel driving circuit and corresponding layers of a second pixel driving circuit directly adjacent to each other and in a same row have a substantially mirror symmetry with respect to each other.

In another aspect, the present disclosure provides a display apparatus, comprising the array substrate described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of pixel driving circuits. Optionally, a respective pixel driving circuit of the plurality of pixel driving circuit comprises a driving transistor, a compensating transistor, and a first reset transistor. Optionally, an active layer of the driving transistor is in a first semiconductor material layer. Optionally, active layers of the compensating transistor and the first reset transistor are in a second semiconductor material layer different from the first semiconductor material layer. Optionally, the array substrate includes a third connecting line in a first signal line layer, and connected to a second electrode of the compensating transistor. Optionally, the third connecting line crosses over at least two control signal lines.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
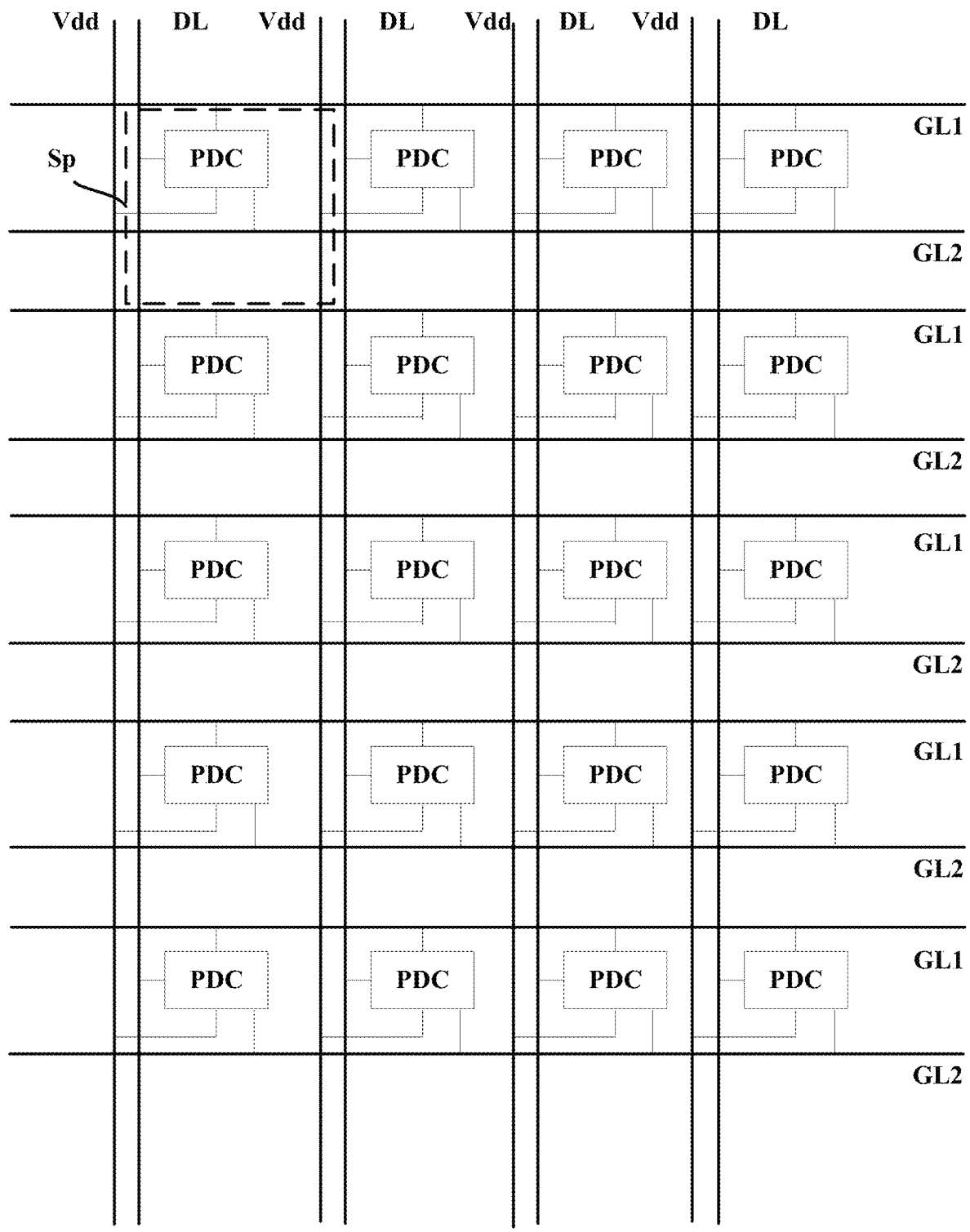
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of first gate lines GL1, a plurality of second gate lines GL2, a plurality of data lines DL, a plurality of voltage supply line Vdd, and a respective second voltage supply line (e.g., a low voltage supply line Vss). Light emission in a respective subpixel Sp is driven by a respective pixel driving circuit PDC. In one example, a high voltage signal (e.g., a VDD signal) is input, through the respective high voltage supply line of the plurality of voltage supply line Vdd, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Figure 2A:
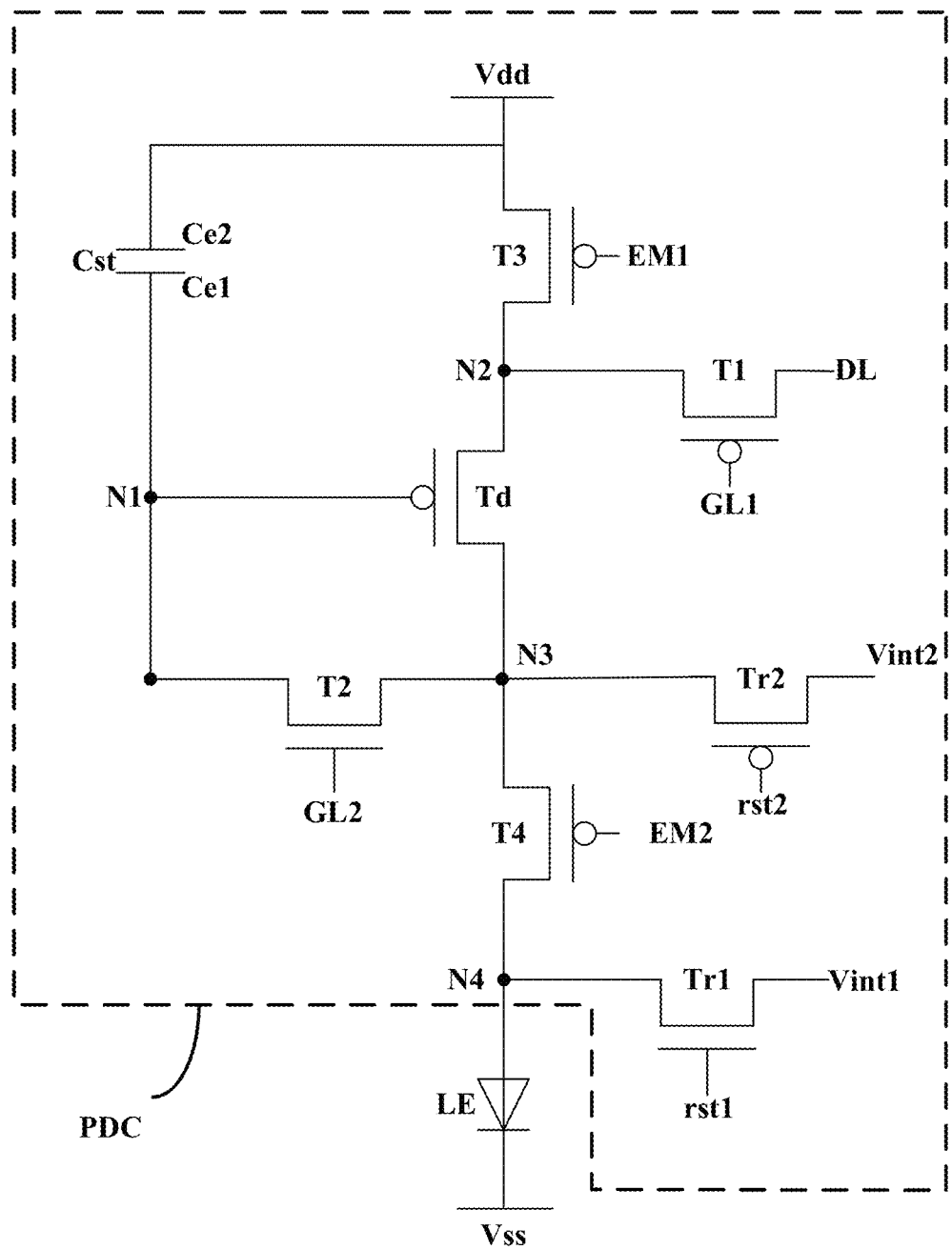
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the pixel driving circuit includes a driving transistor Td; a storage capacitor Cst having a first capacitor electrode Ce1 and a second capacitor electrode Ce2; a second reset transistor Tr2 having a gate electrode connected to a respective second reset control signal line rst2 of a plurality of second reset control signal lines, a first electrode connected to a respective second reset signal line Vint2 of a plurality of second reset signal lines, and a second electrode connected to a second electrode of the driving transistor Td; a first transistor T1 having a gate electrode connected to a respective first gate line GL1 of a plurality of first gate lines, a first electrode connected to a respective data line DL of a plurality of data lines, and a second electrode connected to a first electrode of the driving transistor Td; a second transistor T2 having a gate electrode connected to a respective second gate line GL2 of a plurality of second gate lines, a first electrode connected to the first capacitor electrode Ce1 of the storage capacitor Cst and the gate electrode of the driving transistor Td, and a second electrode connected to the second electrode of the driving transistor Td; a third transistor T3 having a gate electrode connected to a respective first light emitting control signal line EM1 of a plurality of first light emitting control signal lines, a first electrode connected to a respective voltage supply line Vdd of a plurality of voltage supply lines, and a second electrode connected to the first electrode of the driving transistor Td and the second electrode of the first transistor T1; a fourth transistor T4 having a gate electrode connected to the respective second light emitting control signal line EM2 of a plurality of second light emitting control signal lines, a first electrode connected to second electrodes of the driving transistor Td and the second transistor T2, and a second electrode connected to an anode of a light emitting element LE; and a first reset transistor Tr1 having a gate electrode connected to a respective first reset control signal line rst1 of a plurality of first reset control signal lines, a first electrode connected to a respective first reset signal line Vint1 of a plurality of first reset signal lines, and a second electrode connected to the second electrode of the fourth transistor T4 and the anode of the light emitting element LE. The second capacitor electrode Ce2 is connected to the respective voltage supply line and the first electrode of the third transistor T3.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

The pixel driving circuit further include a first node N1, a second node N2, a third node N3, and a fourth node N4. The first node N1 is connected to the gate electrode of the driving transistor Td, the first capacitor electrode Ce1, and the first electrode of the second transistor T2. The second node N2 is connected to the second electrode of the third transistor T3, the second electrode of the first transistor T1, and the first electrode of the driving transistor Td. The third node N3 is connected to the second electrode of the driving transistor Td, the second electrode of the second transistor T2, the first electrode of the fourth transistor T4, and the second electrode of the second reset transistor Tr2. The fourth node N4 is connected to the second electrode of the fourth transistor T4, the second electrode of the first reset transistor Tr1, and the anode of the light emitting element LE.

Figure 2B:
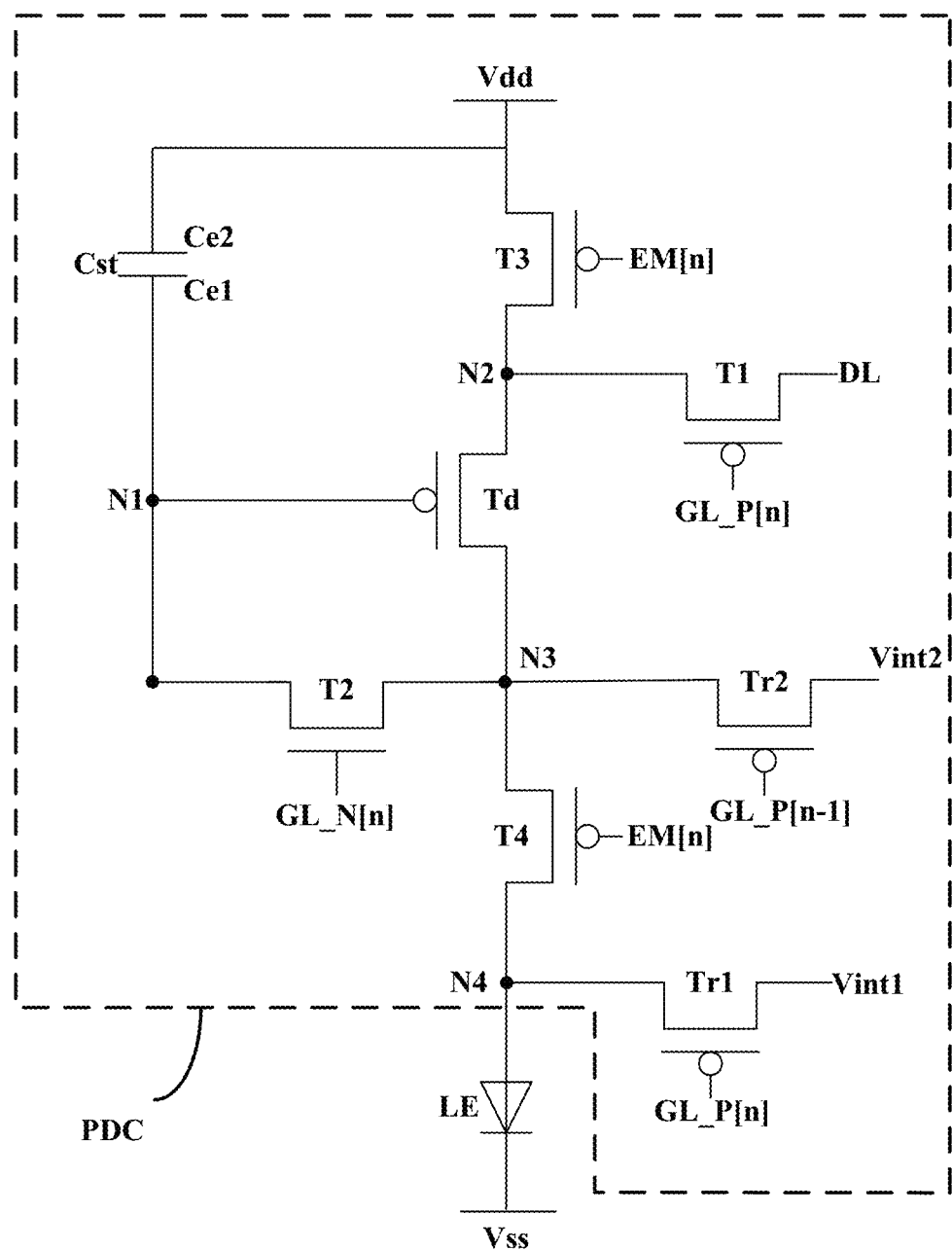
FIG. 2B is a circuit diagram illustrating the structure of a pixel driving circuit in some embodiments according to the present disclosure.

Various alternative implementations may be practiced in the present disclosure. FIG. 2B is a circuit diagram illustrating the structure of a pixel driving circuit in some embodiments according to the present disclosure. Referring to FIG. 2B, in some embodiments, the pixel driving circuit includes a driving transistor Td; a storage capacitor Cst having a first capacitor electrode Ce1 and a second capacitor electrode Ce2; a second reset transistor Tr2 having a gate electrode connected to a first gate line GL_P[n−1] in a previous stage of a plurality of first gate lines, a first electrode connected to a respective second reset signal line Vint2 of a plurality of second reset signal lines, and a second electrode connected to a second electrode of the driving transistor Td; a first transistor T1 having a gate electrode connected to a first gate line GL_P[n] in a present stage of a plurality of first gate lines, a first electrode connected to a respective data line DL of a plurality of data lines, and a second electrode connected to a first electrode of the driving transistor Td; a second transistor T2 having a gate electrode connected to a respective second gate line GL_N[n] in a present stage of a plurality of second gate lines, a first electrode connected to the first capacitor electrode Ce1 of the storage capacitor Cst and the gate electrode of the driving transistor Td, and a second electrode connected to the second electrode of the driving transistor Td; a third transistor T3 having a gate electrode connected to a respective light emitting control signal line EM[n] of a plurality of light emitting control signal lines, a first electrode connected to a respective voltage supply line Vdd of a plurality of voltage supply lines, and a second electrode connected to the first electrode of the driving transistor Td and the second electrode of the first transistor T1; a fourth transistor T4 having a gate electrode connected to the respective light emitting control signal line EM[n], a first electrode connected to second electrodes of the driving transistor Td and the second transistor T2, and a second electrode connected to an anode of a light emitting element LE; and a first reset transistor Tr1 having a gate electrode connected to the first gate line GL_P[n] in the present stage of a plurality of first gate lines, a first electrode connected to a respective first reset signal line Vint1 of a plurality of first reset signal lines, and a second electrode connected to the second electrode of the fourth transistor T4 and the anode of the light emitting element LE. The second capacitor electrode Ce2 is connected to the respective voltage supply line and the first electrode of the third transistor T3.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is an R-G-μ-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the first reset transistor Tr1, the second reset transistor Tr2, and the driving transistor Td.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. Referring to FIG. 2A, the first reset transistor Tr1 and the second transistor T2 are n-type transistors such as metal oxide transistors, and other transistors are p-type transistors such as polysilicon transistors. Referring to FIG. 2B, the second transistor T2 is an n-type transistor such as a metal oxide transistor, and other transistors are p-type transistors such as polysilicon transistors. For a p-type transistor, an effective control signal (e.g., a turn-on control signal) is a low voltage signal, and an ineffective control signal (e.g., a turn-off control signal) is a high voltage signal. For an n-type transistor, an effective control signal (e.g., a turn-on control signal) is a high voltage signal, and an ineffective control signal (e.g., a turn-off control signal) is a low voltage signal.

Figure 2C:
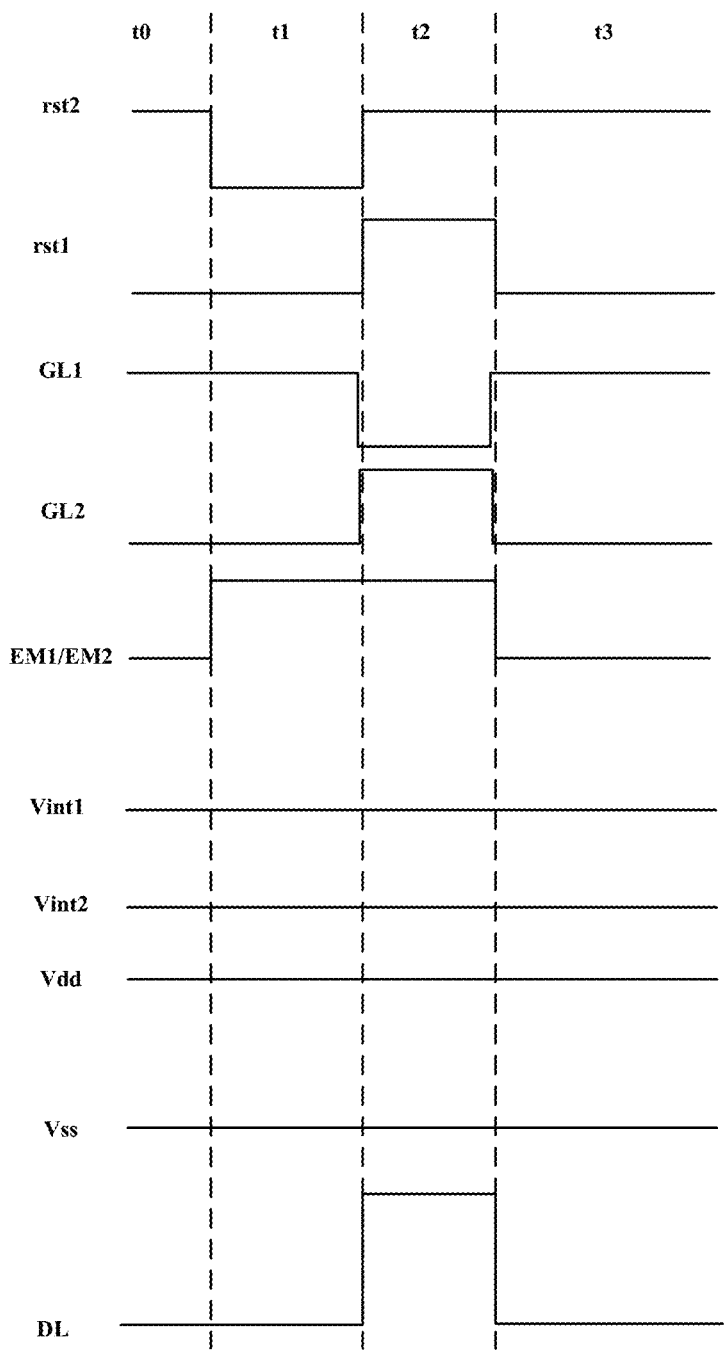
FIG. 2C is a timing diagram illustrating the operation of a pixel driving circuit in some embodiments according to the present disclosure.

FIG. 2C is a timing diagram illustrating the operation of a pixel driving circuit in some embodiments according to the present disclosure. Referring to FIG. 2A and FIG. 2C, during one frame of image, the operation of the pixel driving circuit includes a reset sub-phase t1, a data write sub-phase t2, and a light emitting sub-phase t3. In the initial sub-phase t0, a turning-off reset control signal is provided through the respective second reset control signal line rst2 to the gate electrode of the second reset transistor Tr2 to turn off the second reset transistor Tr2. In the initial sub-phase t0, the respective first gate line GL1 and the respective second gate line GL2 are provided with a turning-off signal, thus the first transistor T1 and the second transistor T2 are turned off.

In the reset sub-phase t1, a turning-on reset control signal is provided through the second reset control signal line rst2 to the gate electrode of the second reset transistor Tr2 to turn on the second reset transistor Tr2; allowing an initialization voltage signal from the respective second reset signal line Vint2 to pass from a first electrode of the second reset transistor Tr2 to a second electrode of the second reset transistor Tr2, and in turn to the node N3. The second electrode of the driving transistor Td is initialized. The second capacitor electrode Ce2 receives a high voltage signal from the respective voltage supply line Vdd. The first capacitor electrode Ce1 is in a charged state in the reset sub-phase t1 due to a voltage difference between the first capacitor electrode Ce1 and the second capacitor electrode Ce2. In the reset sub-phase t1, the respective first gate line GL1 and the respective second gate line GL2 are provided with a turning-off signal, thus the first transistor T1 and the second transistor T2 are turned off. The respective first light emitting control signal line EM1 and the respective second light emitting control signal line EM2 are provided with a high voltage signal to turn off the third transistor T3 and the fourth transistor T4.

In the data write sub-phase t2, the turning-off reset control signal is again provided through the respective second reset control signal line rst2 to the gate electrode of the second reset transistor Tr2 to turn off the second reset transistor Tr2. The respective first gate line GL1 and the respective second gate line GL2 are provided with a turning-on signal, thus the first transistor T1 and the second transistor T2 are turned on. A second electrode of the driving transistor Td is connected with the second electrode of the second transistor T2. A gate electrode of the driving transistor Td is electrically connected with the first electrode of the second transistor T2. Because the second transistor T2 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The first transistor T1 is turned on in the data write sub-phase t2. The data voltage signal transmitted through the respective data line DL is received by a first electrode of the first transistor T1, and in turn transmitted to the first electrode of the driving transistor Td, which is connected to the second electrode of the first transistor T1. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective first light emitting control signal line EM1 and the respective second light emitting control signal line EM2 are provided with a high voltage signal to turn off the third transistor T3 and the fourth transistor T4.

In the data write sub-phase t2, a turning-on reset control signal is provided through the respective first reset control signal line rst1 to the gate electrode of the first reset transistor Tr1 to turn on the first reset transistor Tr1; allowing an initialization voltage signal from the respective first reset signal line Vint1 to pass from a first electrode of the first reset transistor Tr1 to a second electrode of the first reset transistor Tr1; and in turn to the node N4. The anode of the light emitting element LE is initialized.

In the light emitting sub-phase t3, the turning-off reset control signal is again provided through the respective second reset control signal line rst2 to the gate electrode of the second reset transistor Tr2 to turn off the second reset transistor Tr2. The respective first gate line GL1 and the respective second gate line GL2 are provided with a turning-off signal, the first transistor T1 and the second transistor T2 are turned off. The respective first light emitting control signal line EM1 and the respective second light emitting control signal line EM2 are provided with a low voltage signal to turn on the third transistor T3 and the fourth transistor T4. The voltage level at the node N1 in the light emitting sub-phase t3 is maintained at (Vdata+Vth), the driving transistor Td is turned on by the voltage level, and working in the saturation area. A path is formed through the third transistor T3, the driving transistor Td, the fourth transistor T4, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

Figure 3A:
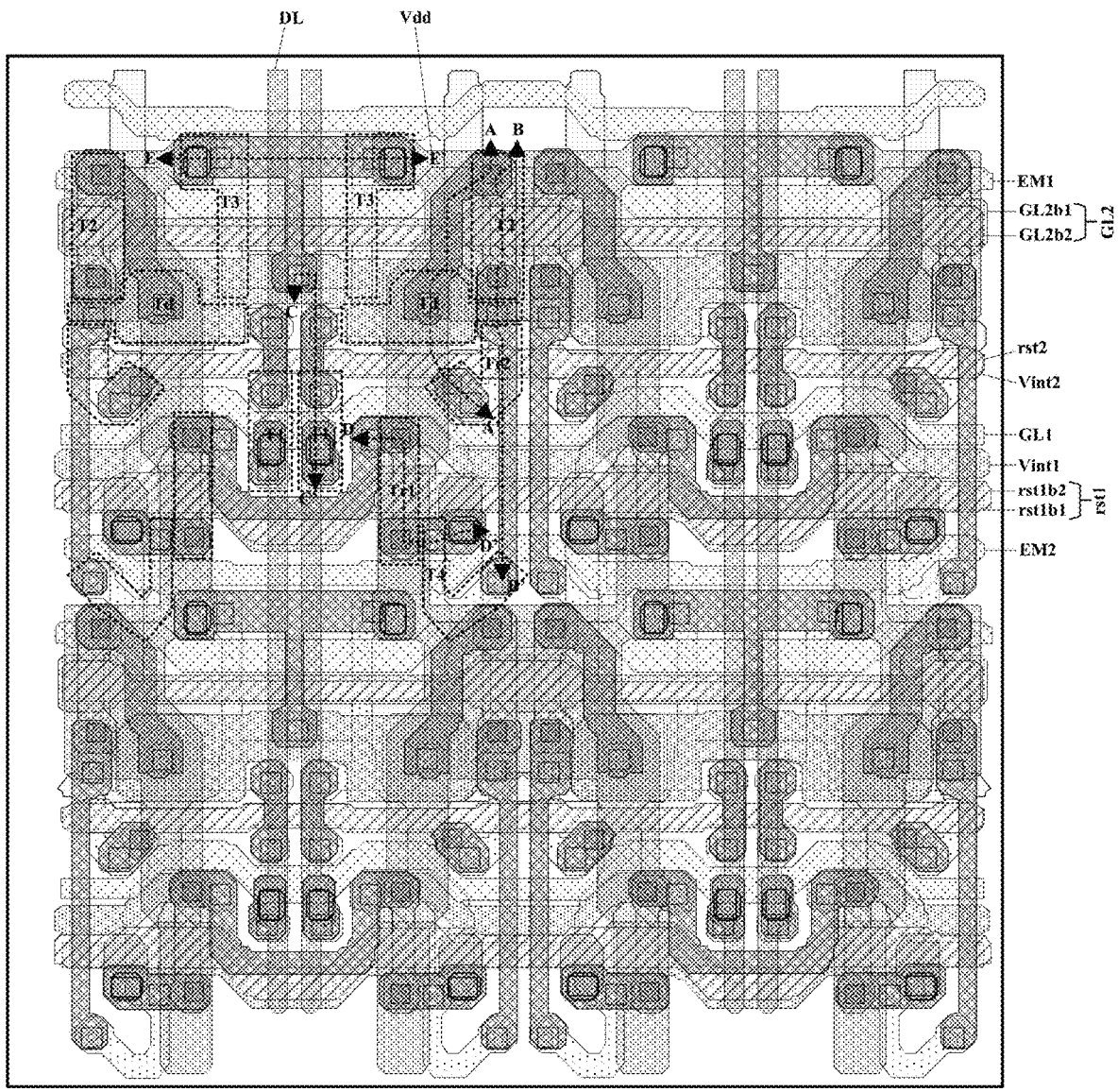
FIG. 3A is a diagram illustrating the structure of pixel driving circuits in an array substrate in some embodiments according to the present disclosure.
Figure 3B:
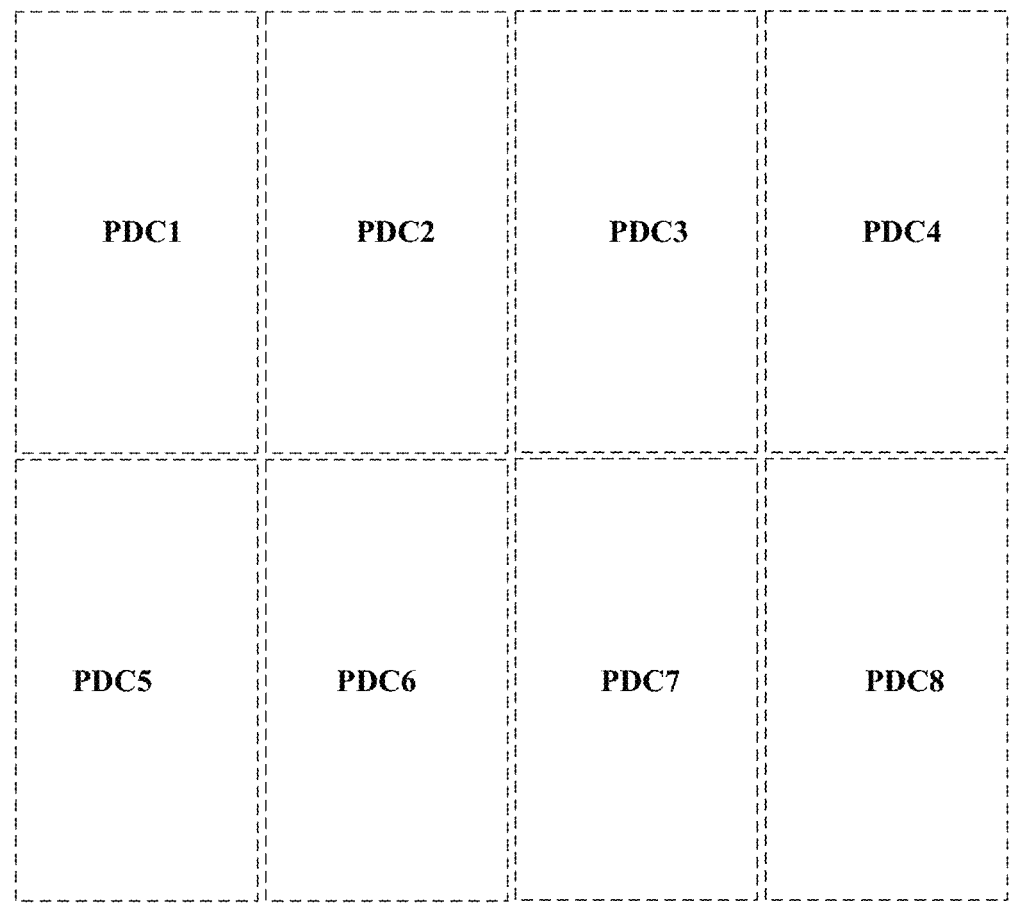
FIG. 3B is a schematic diagram illustrating an arrangement of pixel driving circuits in the array substrate depicted in FIG. 3A.

FIG. 3A is a diagram illustrating the structure of pixel driving circuits in an array substrate in some embodiments according to the present disclosure. FIG. 3B is a schematic diagram illustrating an arrangement of a plurality of pixel driving circuits in an array substrate depicted in FIG. 3A. FIG. 3A and FIG. 3B depicts a portion of the array substrate having eight pixel driving circuits, including PDC1, PDC2, PDC3, PDC4, PDC5, PDC6, PDC7, and PDC8.

Figure 3C:
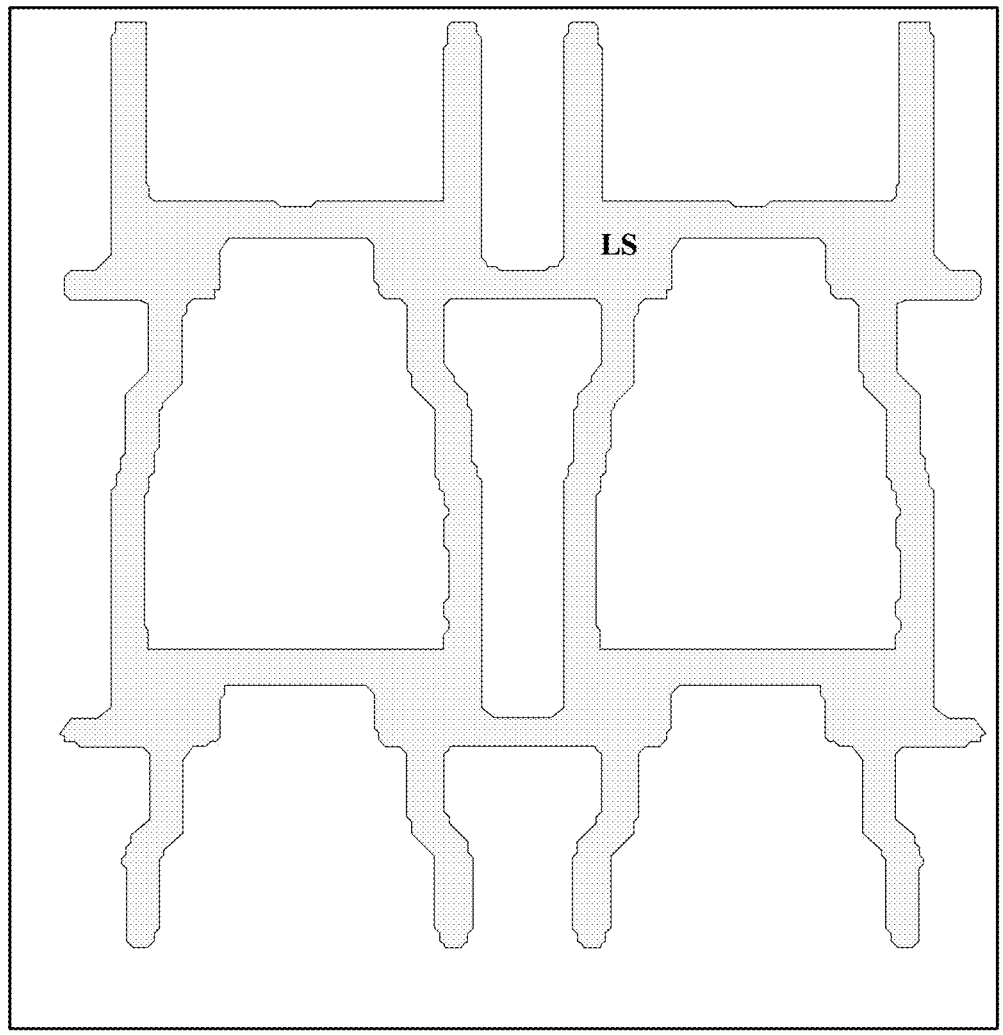
FIG. 3C is a diagram illustrating the structure of a light shielding layer of two adjacent pixel driving circuits in the array substrate depicted in FIG. 3A.
Figure 3D:
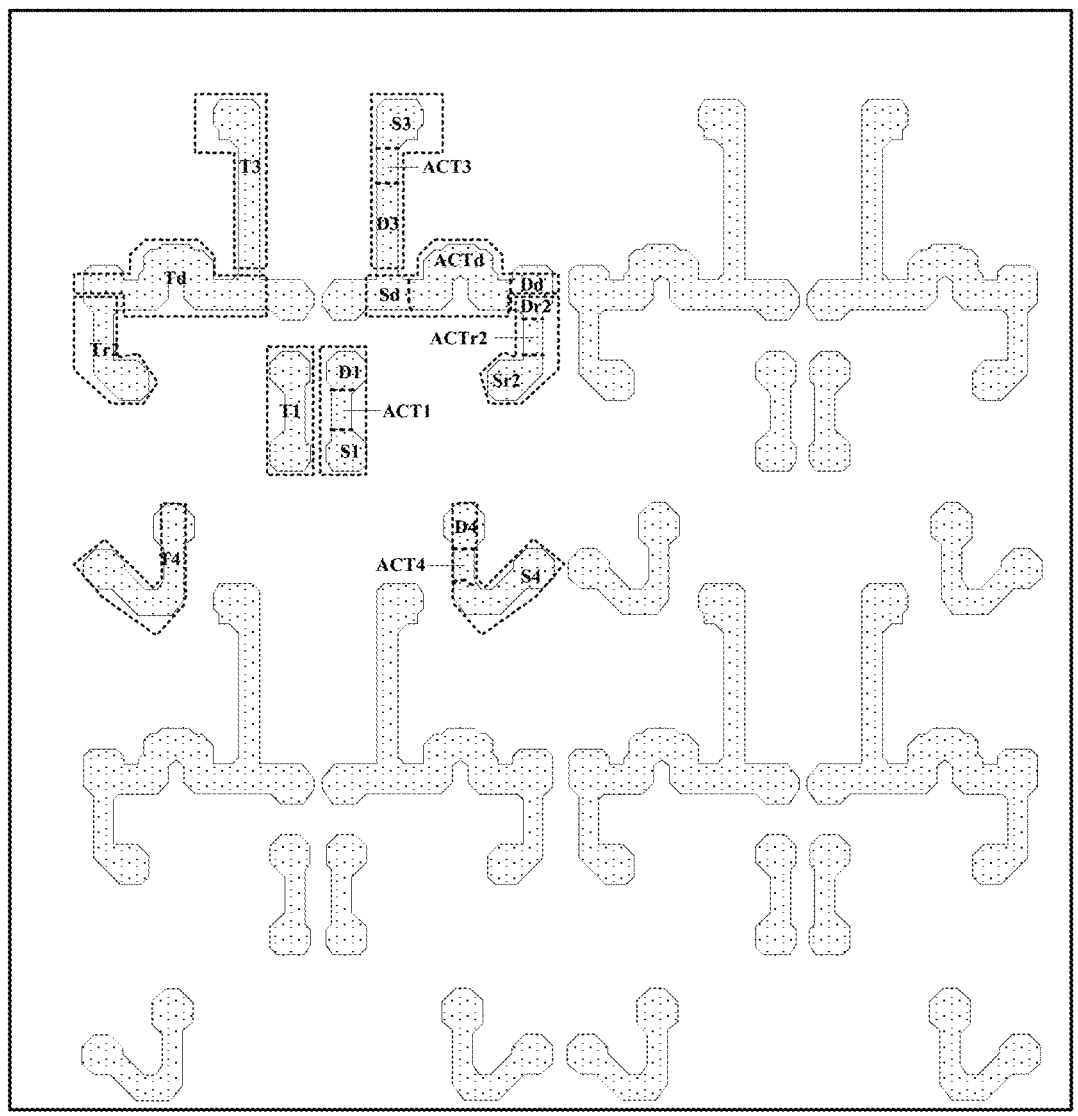
FIG. 3D is a diagram illustrating the structure of a first semiconductor material layer in the array substrate depicted in FIG. 3A.
Figure 3E:
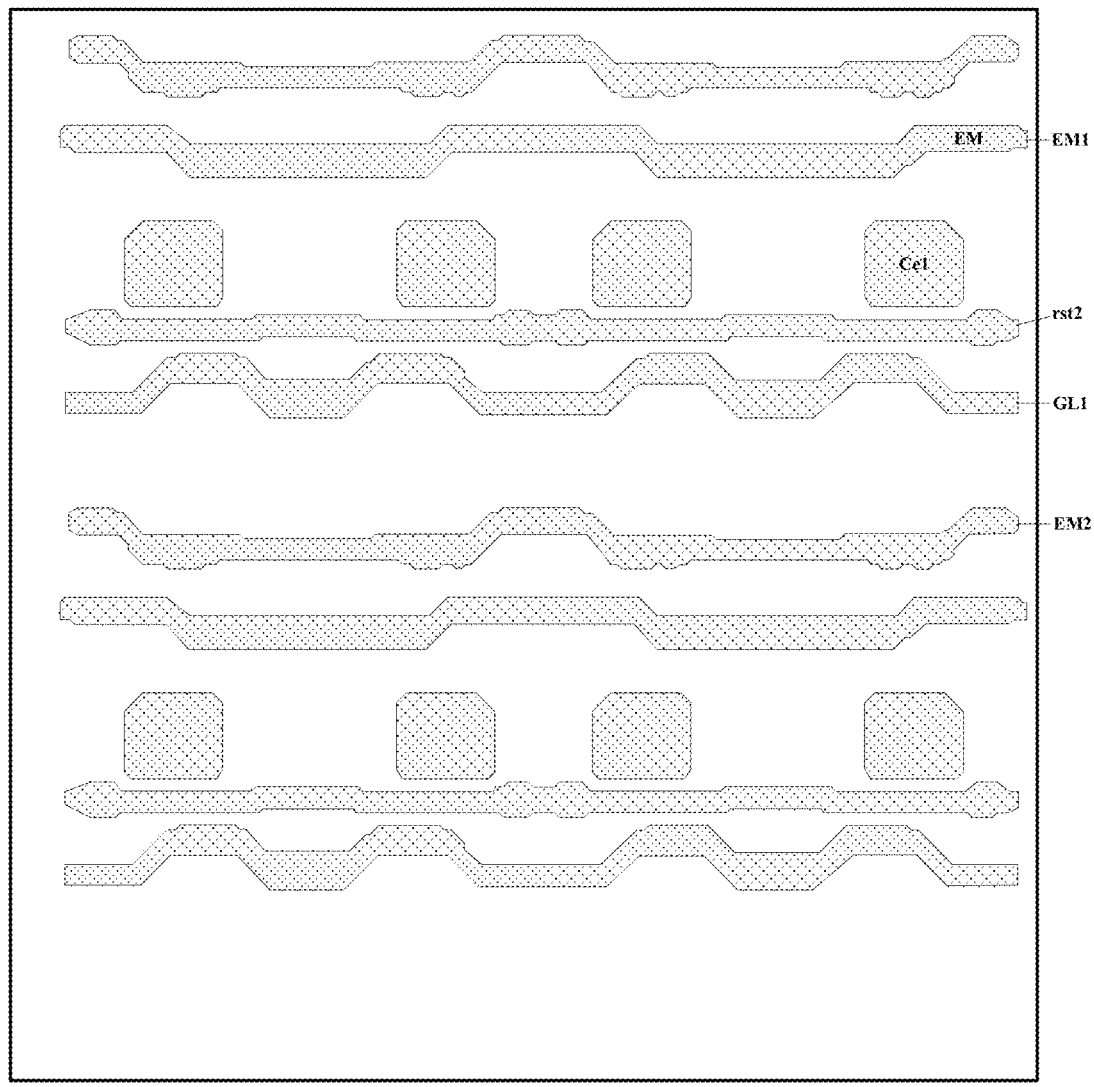
FIG. 3E is a diagram illustrating the structure of a first gate metal layer in the array substrate depicted in FIG. 3A.
Figure 3F:
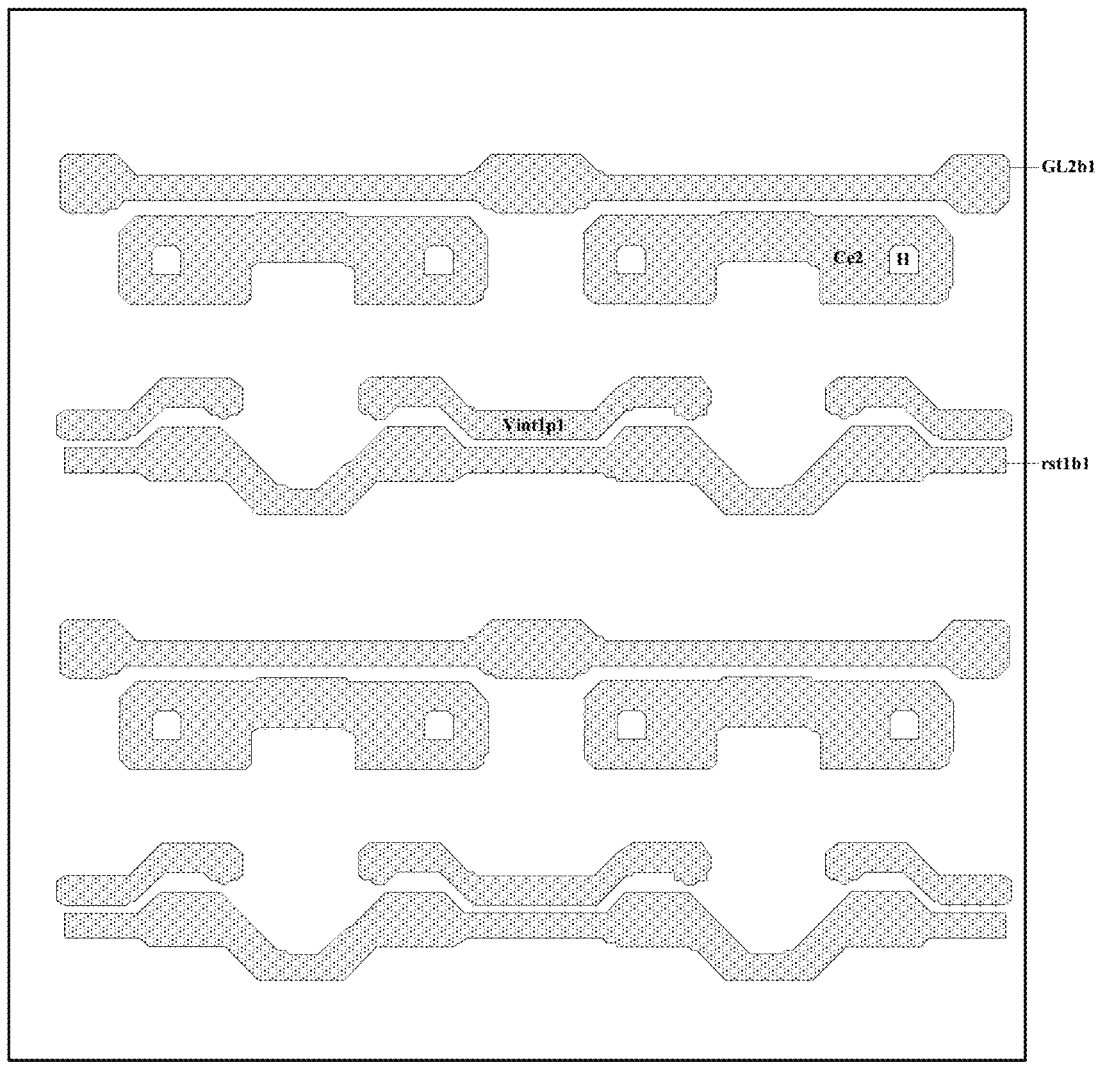
FIG. 3F is a diagram illustrating the structure of a second gate metal layer in the array substrate depicted in FIG. 3A.
Figure 3G:
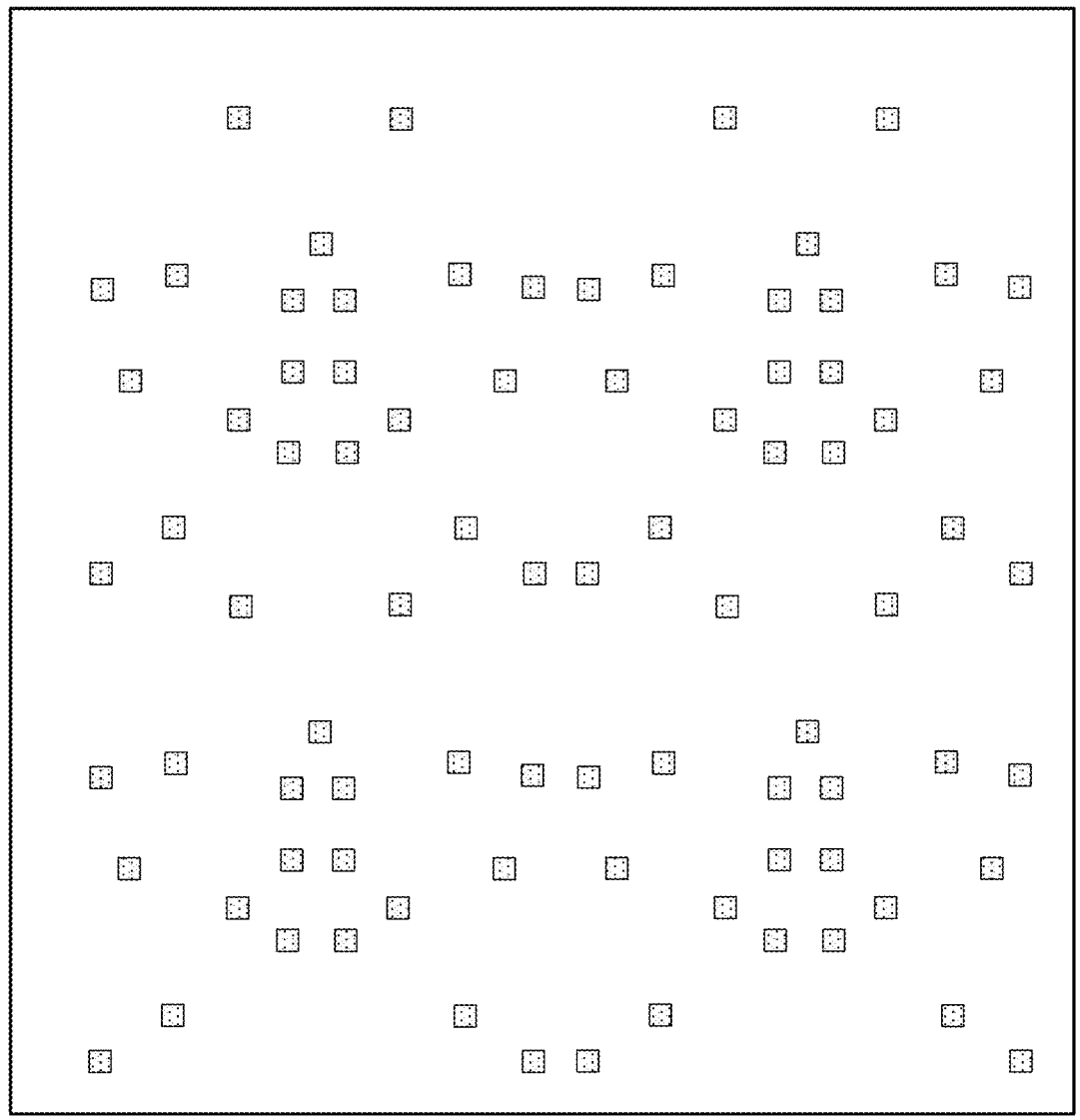
FIG. 3G is a diagram illustrating vias extending through a first inter-layer dielectric layer in the array substrate depicted in FIG. 3A.
Figure 3H:
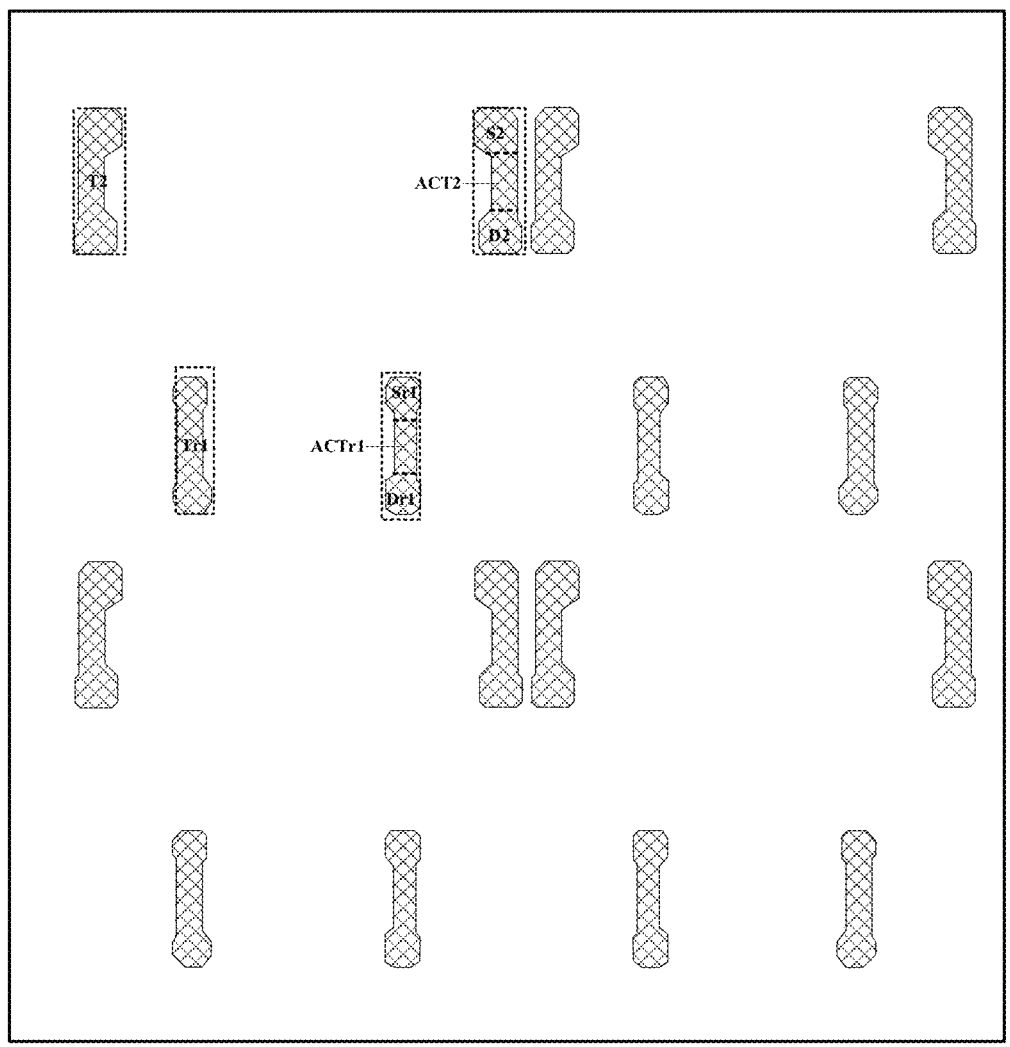
FIG. 3H is a diagram illustrating the structure of a second semiconductor material layer in the array substrate depicted in FIG. 3A.
Figure 3I:
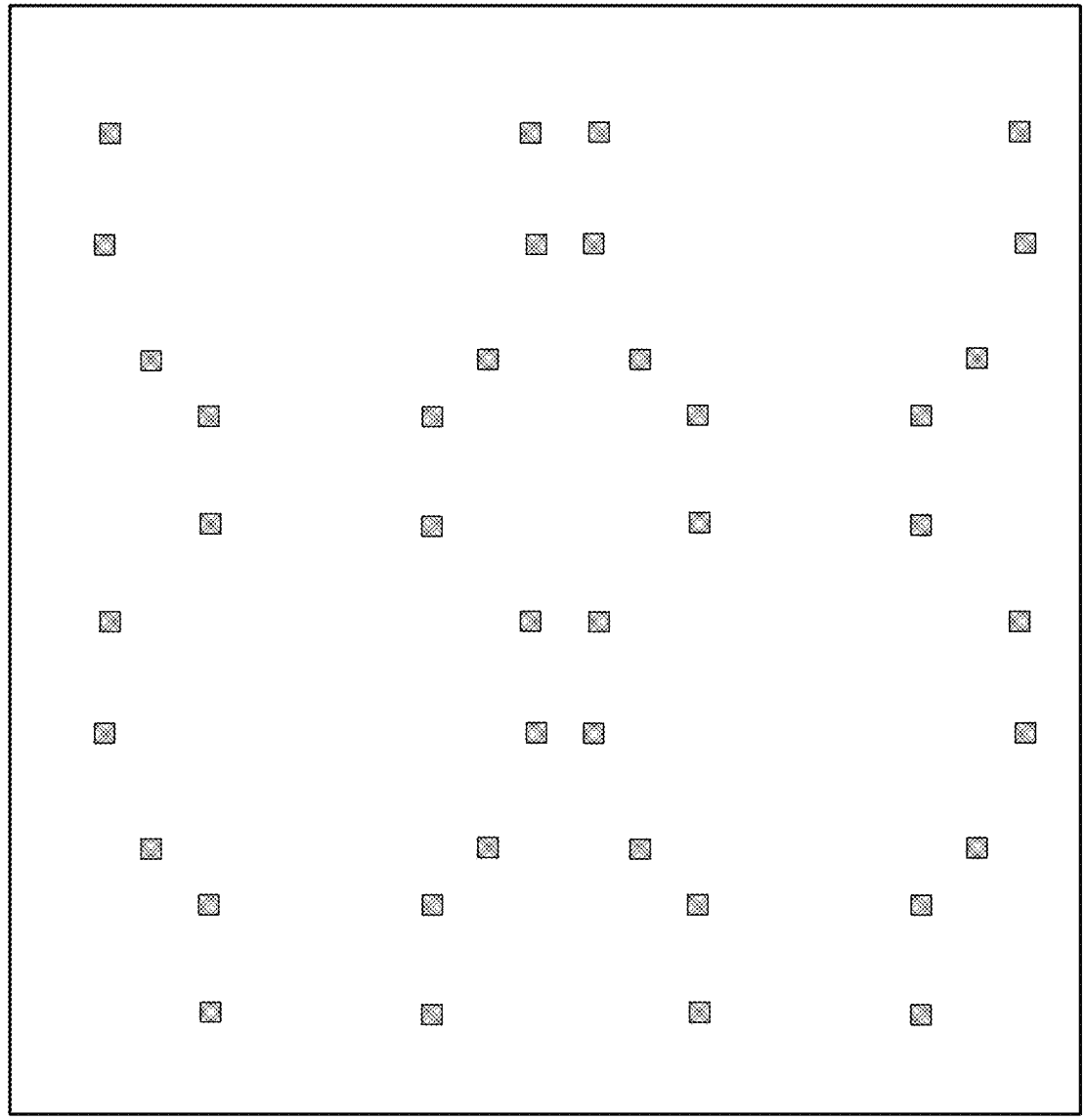
FIG. 3I is a diagram illustrating vias extending through a second inter-layer dielectric layer in the array substrate depicted in FIG. 3A.
Figure 3J:
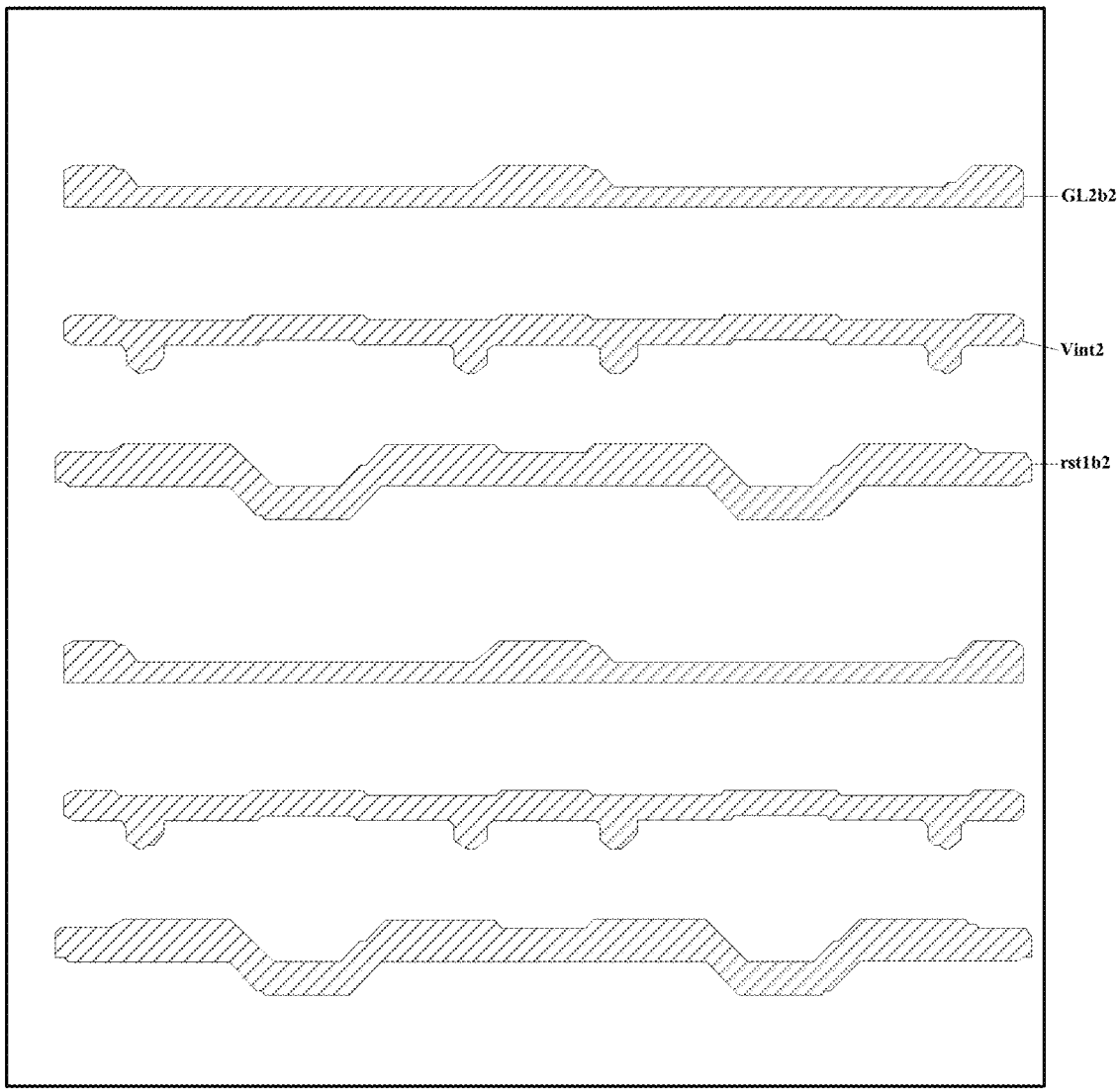
FIG. 3J is a diagram illustrating the structure of a third gate metal layer in the array substrate depicted in FIG. 3A.
Figure 3K:
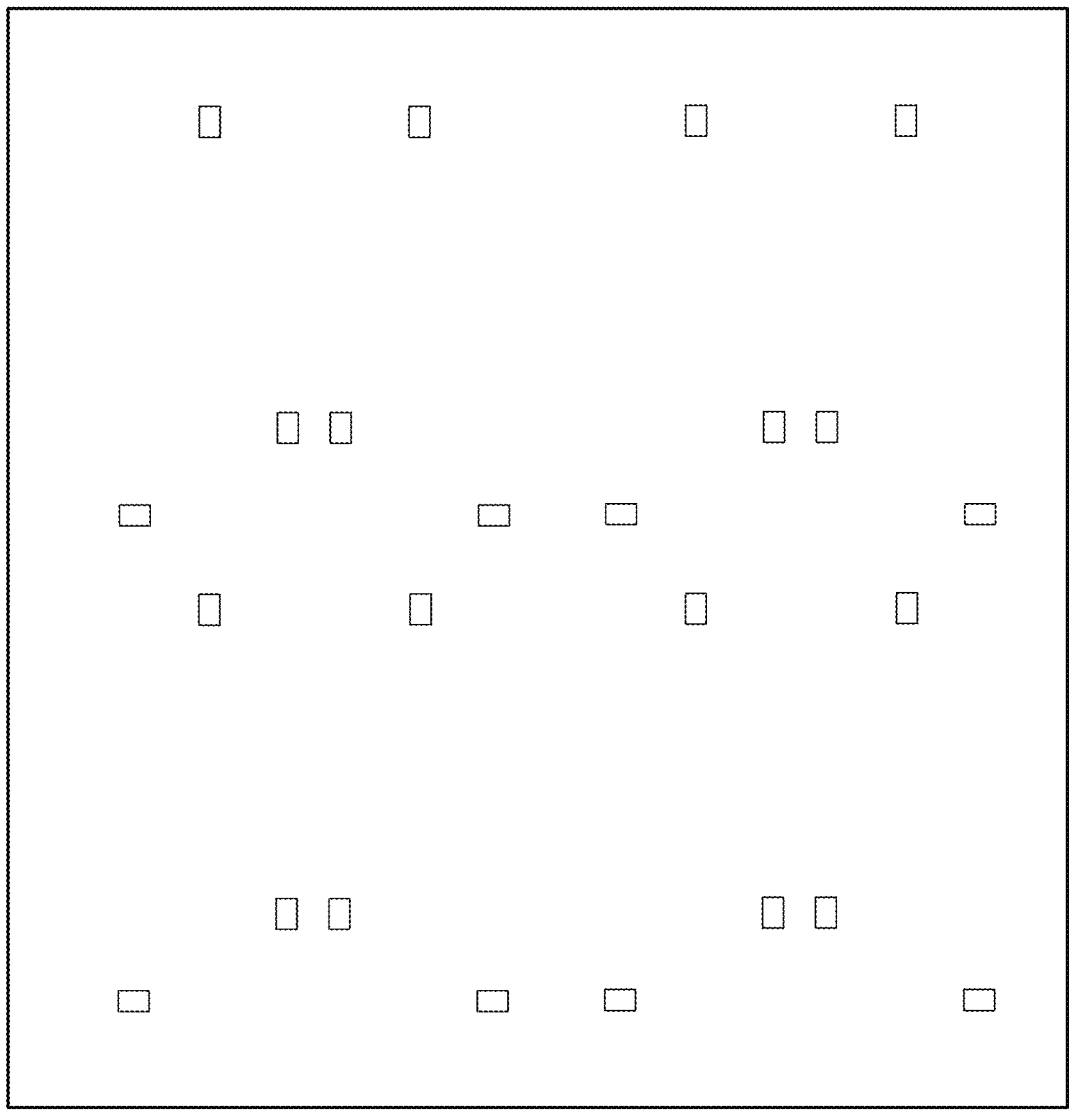
FIG. 3K is a diagram illustrating vias extending through a passivation layer in the array substrate depicted in FIG. 3A.
Figure 3L:
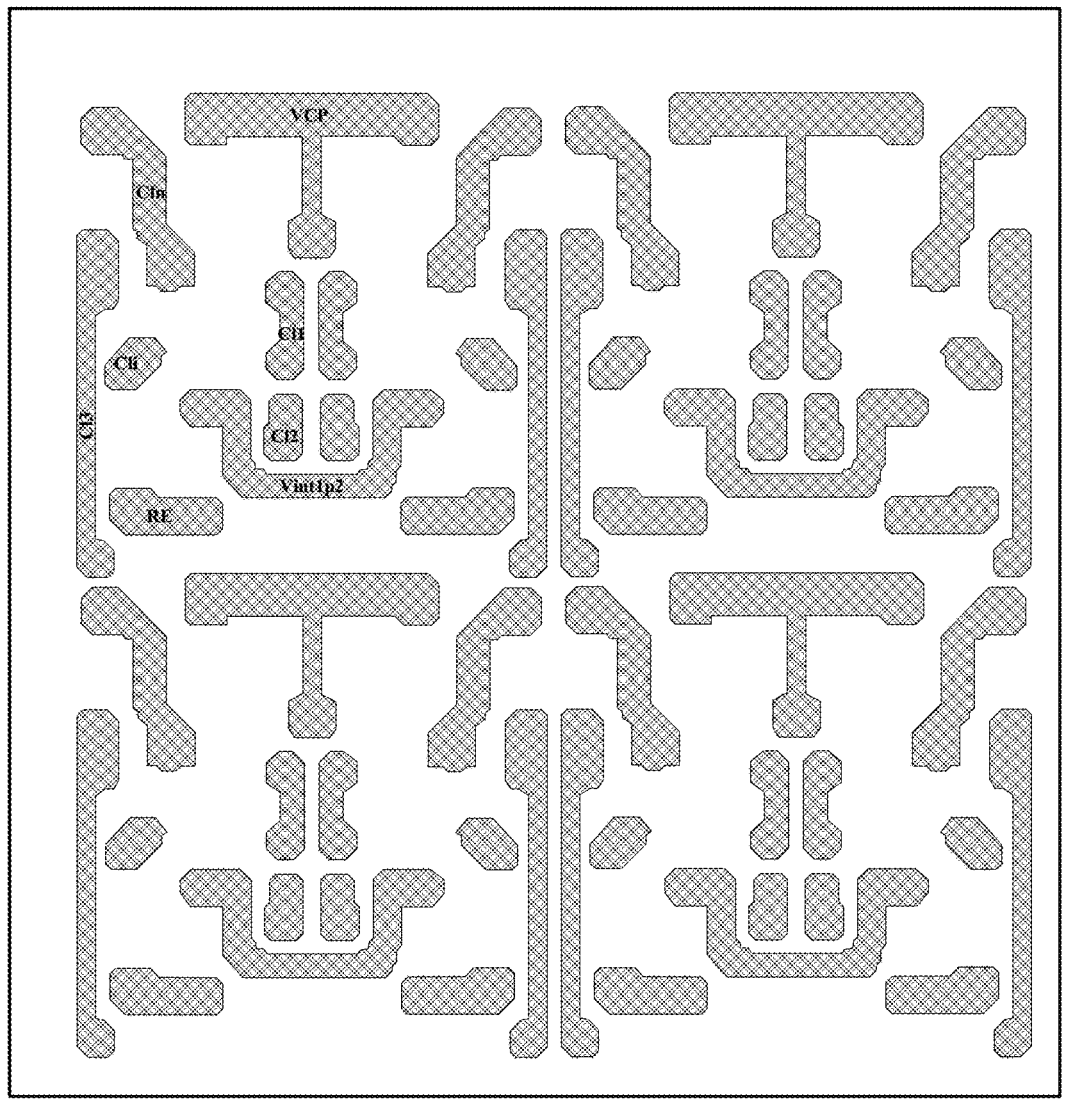
FIG. 3L is a diagram illustrating the structure of a first signal line layer in the array substrate depicted in FIG. 3A.
Figure 3M:
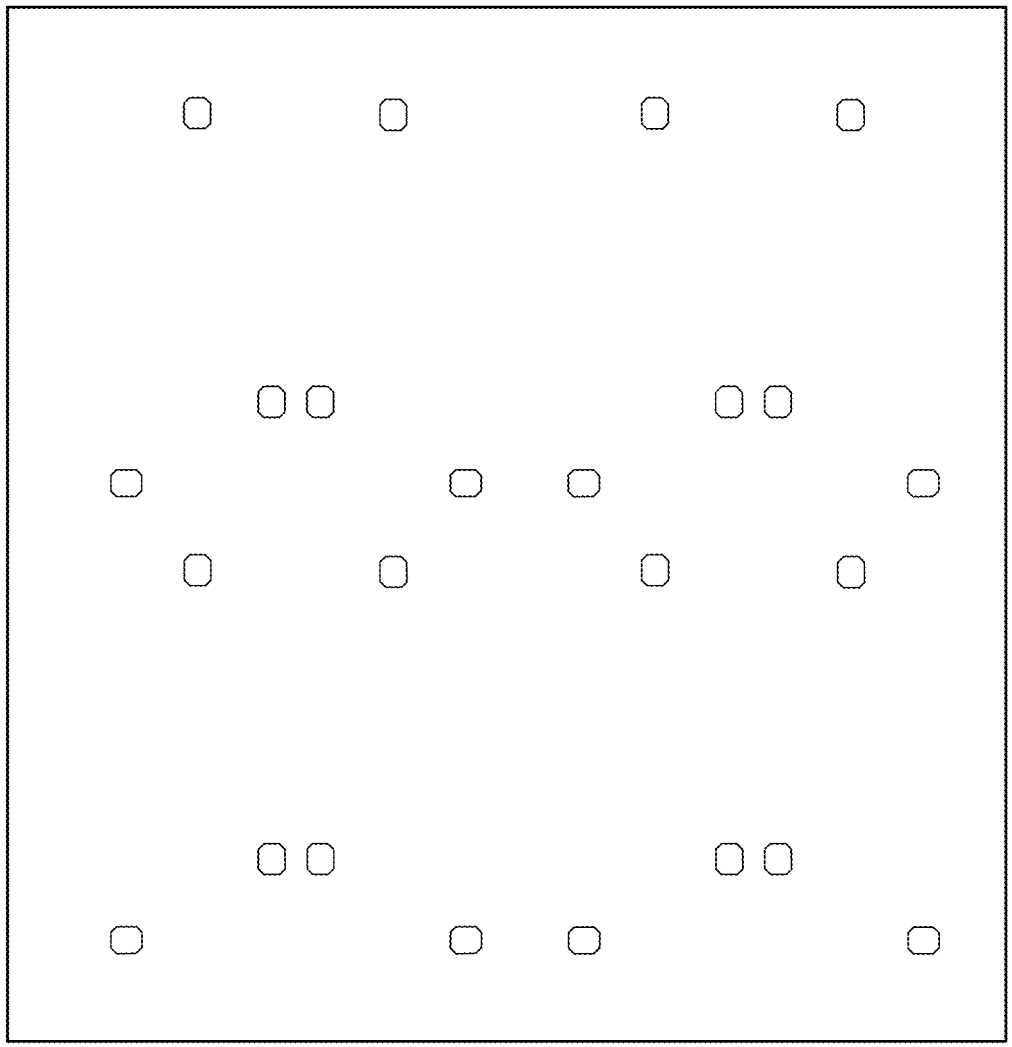
FIG. 3M is a diagram illustrating vias extending through a first planarization layer in the array substrate depicted in FIG. 3A.
Figure 3N:
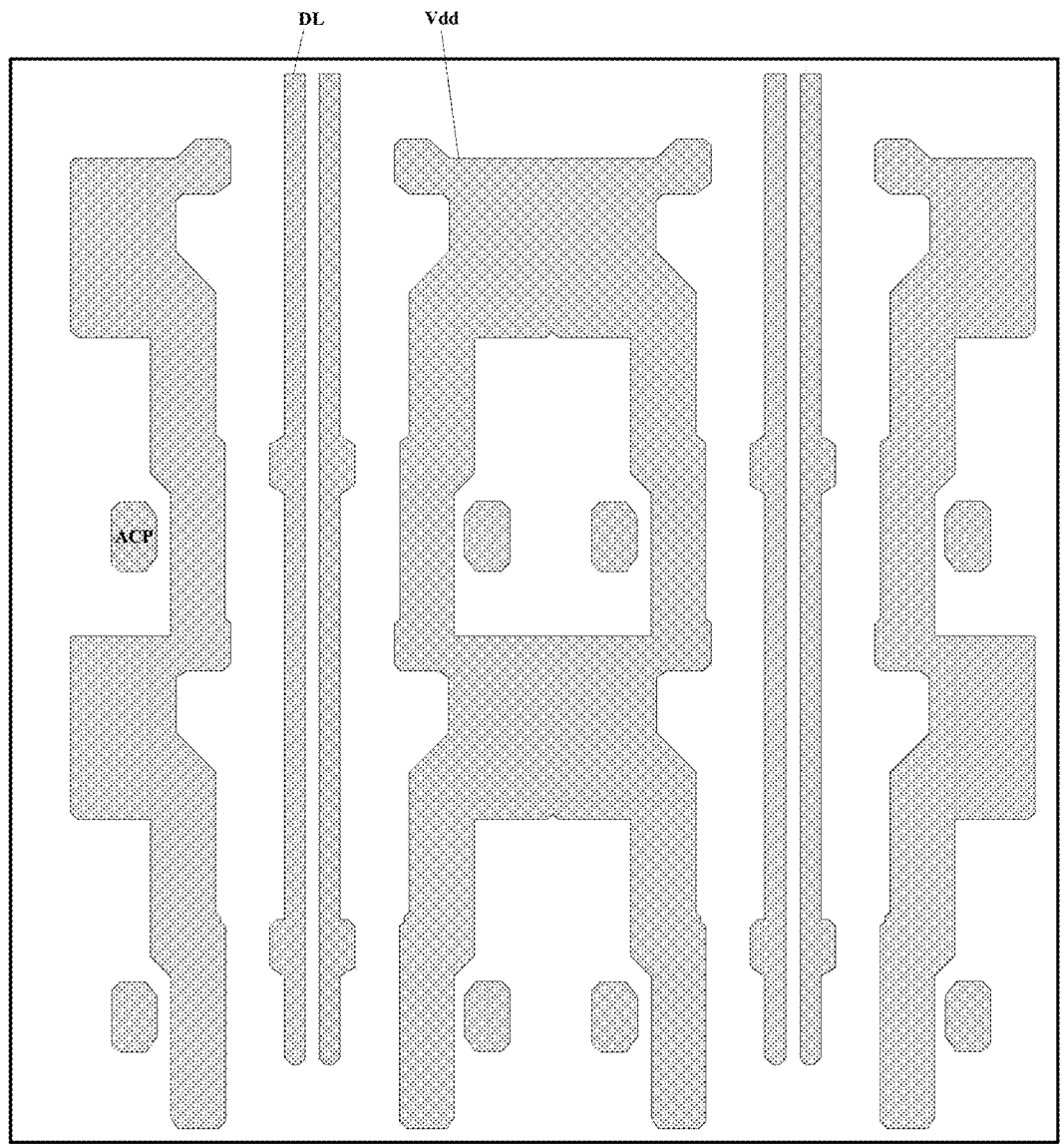
FIG. 3N is a diagram illustrating the structure of a second signal line layer in the array substrate depicted in FIG. 3A.

FIG. 3C is a diagram illustrating the structure of a light shielding layer of two adjacent pixel driving circuits in the array substrate depicted in FIG. 3A. FIG. 3D is a diagram illustrating the structure of a first semiconductor material layer in the array substrate depicted in FIG. 3A. FIG. 3E is a diagram illustrating the structure of a first gate metal layer in the array substrate depicted in FIG. 3A. FIG. 3F is a diagram illustrating the structure of a second gate metal layer in the array substrate depicted in FIG. 3A. FIG. 3G is a diagram illustrating vias extending through a first inter-layer dielectric layer in the array substrate depicted in FIG. 3A. FIG. 3H is a diagram illustrating the structure of a second semiconductor material layer in the array substrate depicted in FIG. 3A. FIG. 3I is a diagram illustrating vias extending through a second inter-layer dielectric layer in the array substrate depicted in FIG. 3A. FIG. 3J is a diagram illustrating the structure of a third gate metal layer in the array substrate depicted in FIG. 3A. FIG. 3K is a diagram illustrating vias extending through a passivation layer in the array substrate depicted in FIG. 3A. FIG. 3L is a diagram illustrating the structure of a first signal line layer in the array substrate depicted in FIG. 3A. FIG. 3M is a diagram illustrating vias extending through a first planarization layer in the array substrate depicted in FIG. 3A. FIG. 3N is a diagram illustrating the structure of a second signal line layer in the array substrate depicted in FIG. 3A.

Figure 4A:
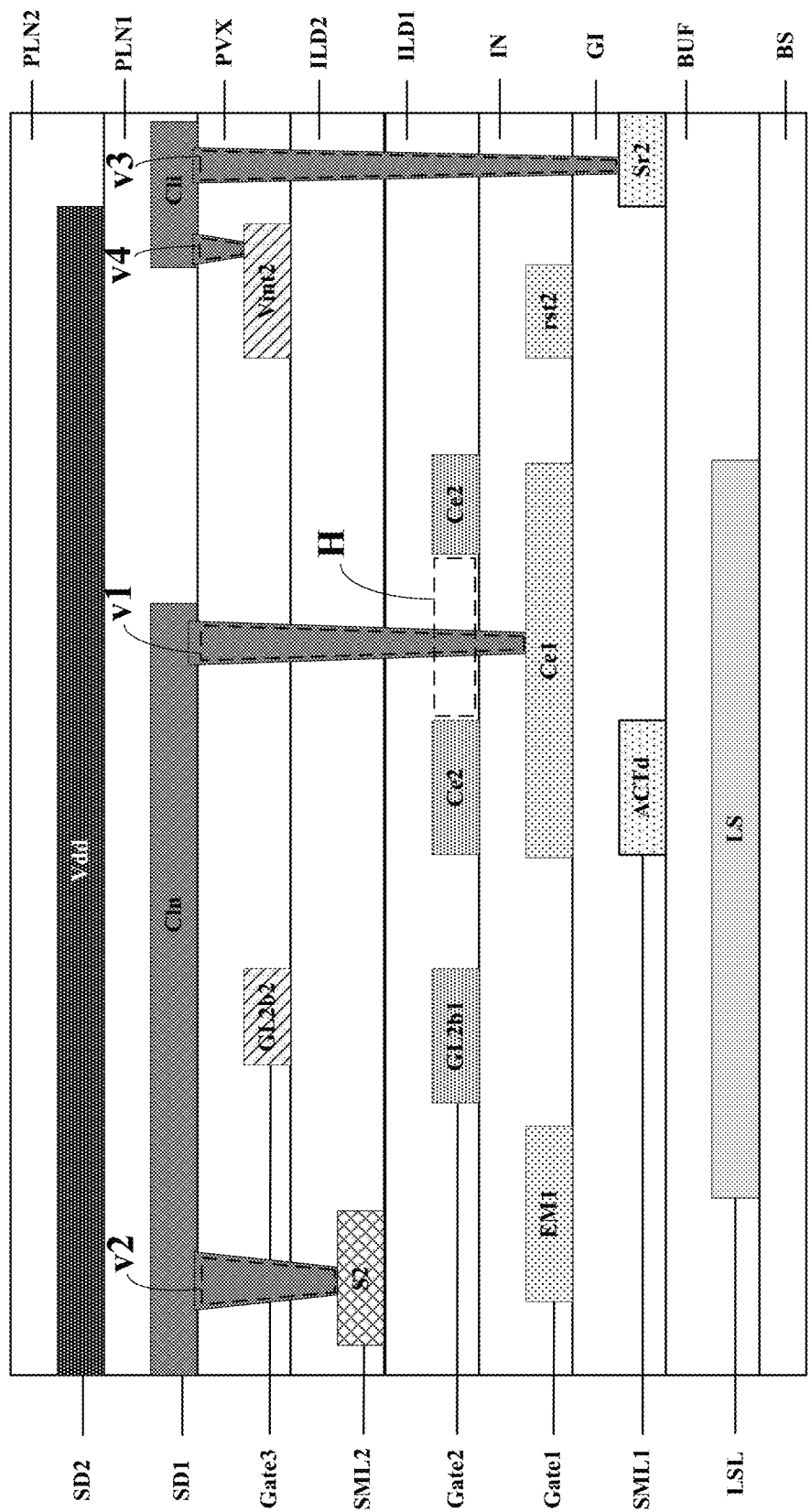
FIG. 4A is a cross-sectional view along an A-A' line in FIG. 3A.
Figure 4B:
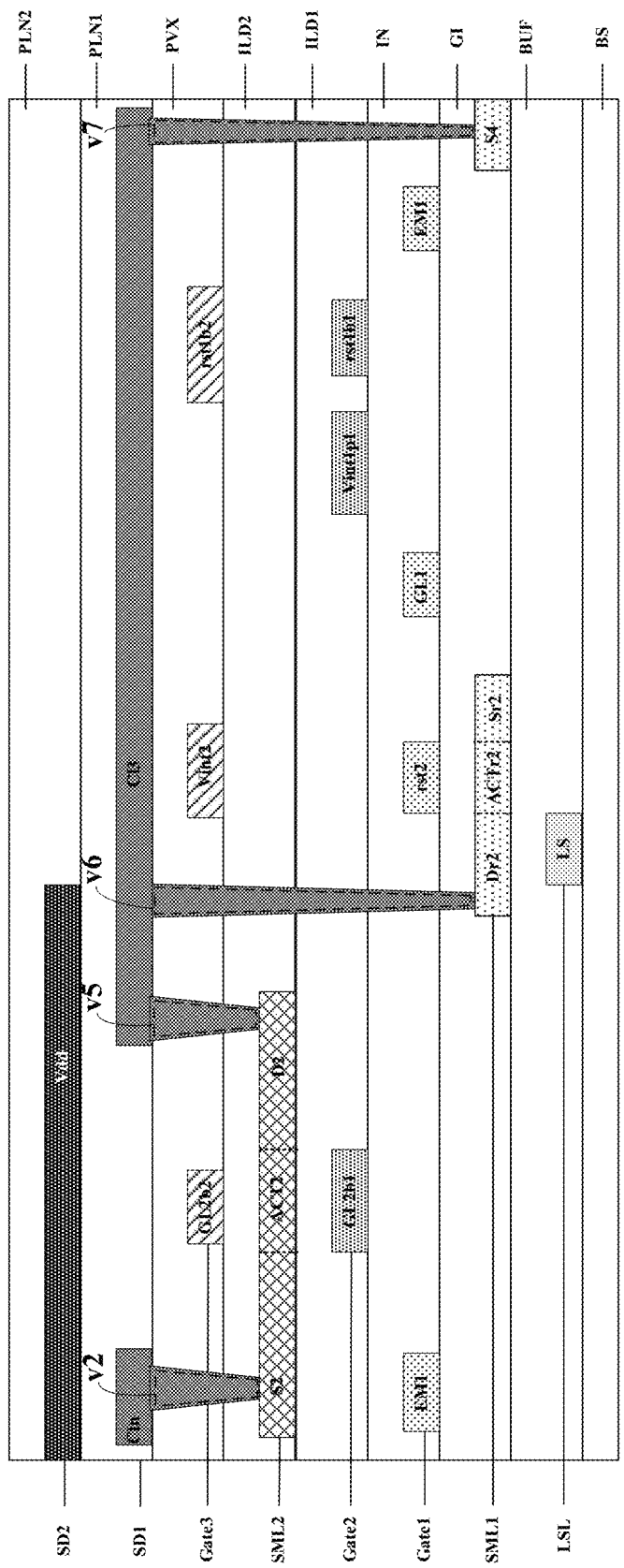
FIG. 4B is a cross-sectional view along a B-B' line in FIG. 3A.
Figure 4C:
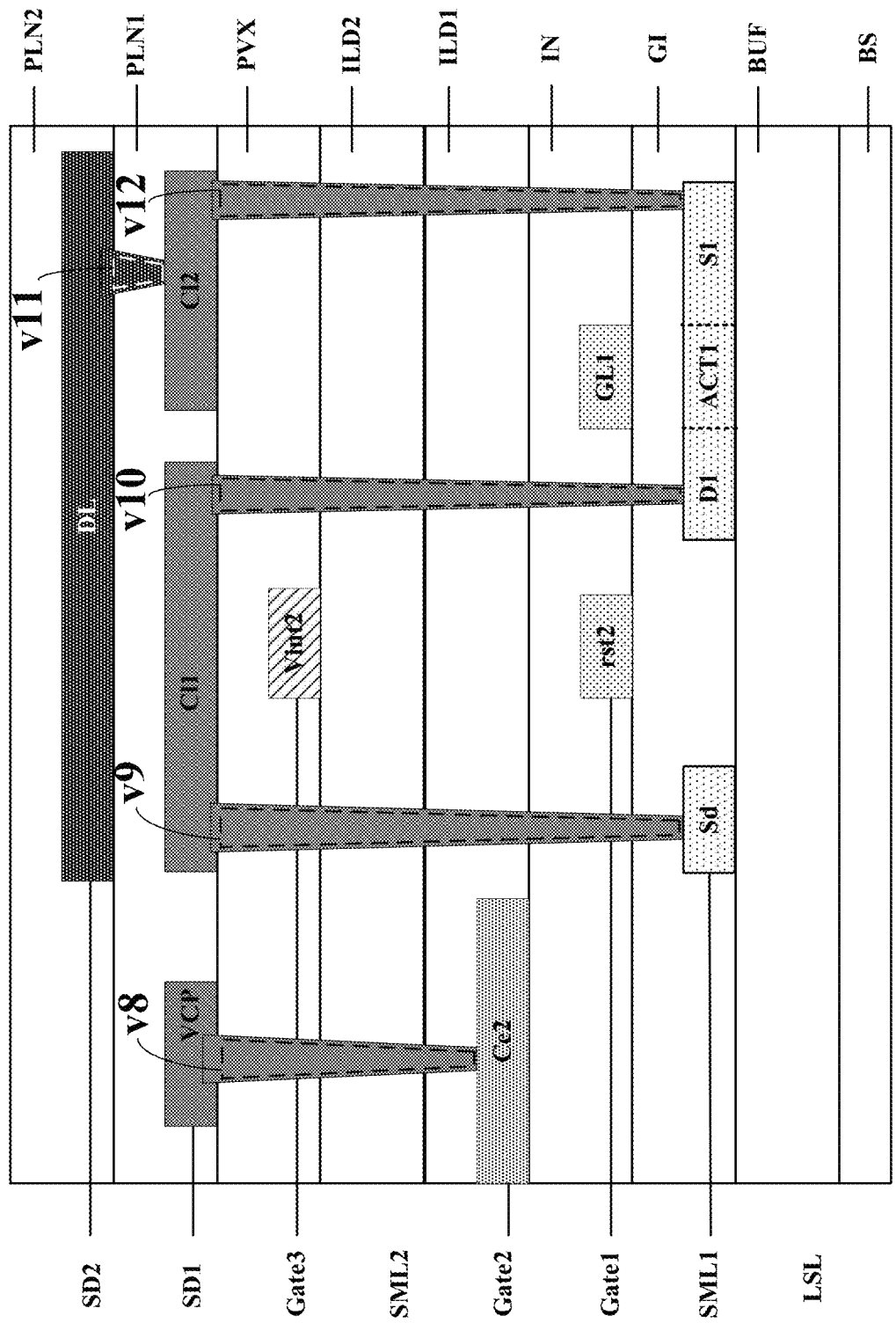
FIG. 4C is a cross-sectional view along a C-C' line in FIG. 3A.
Figure 4D:
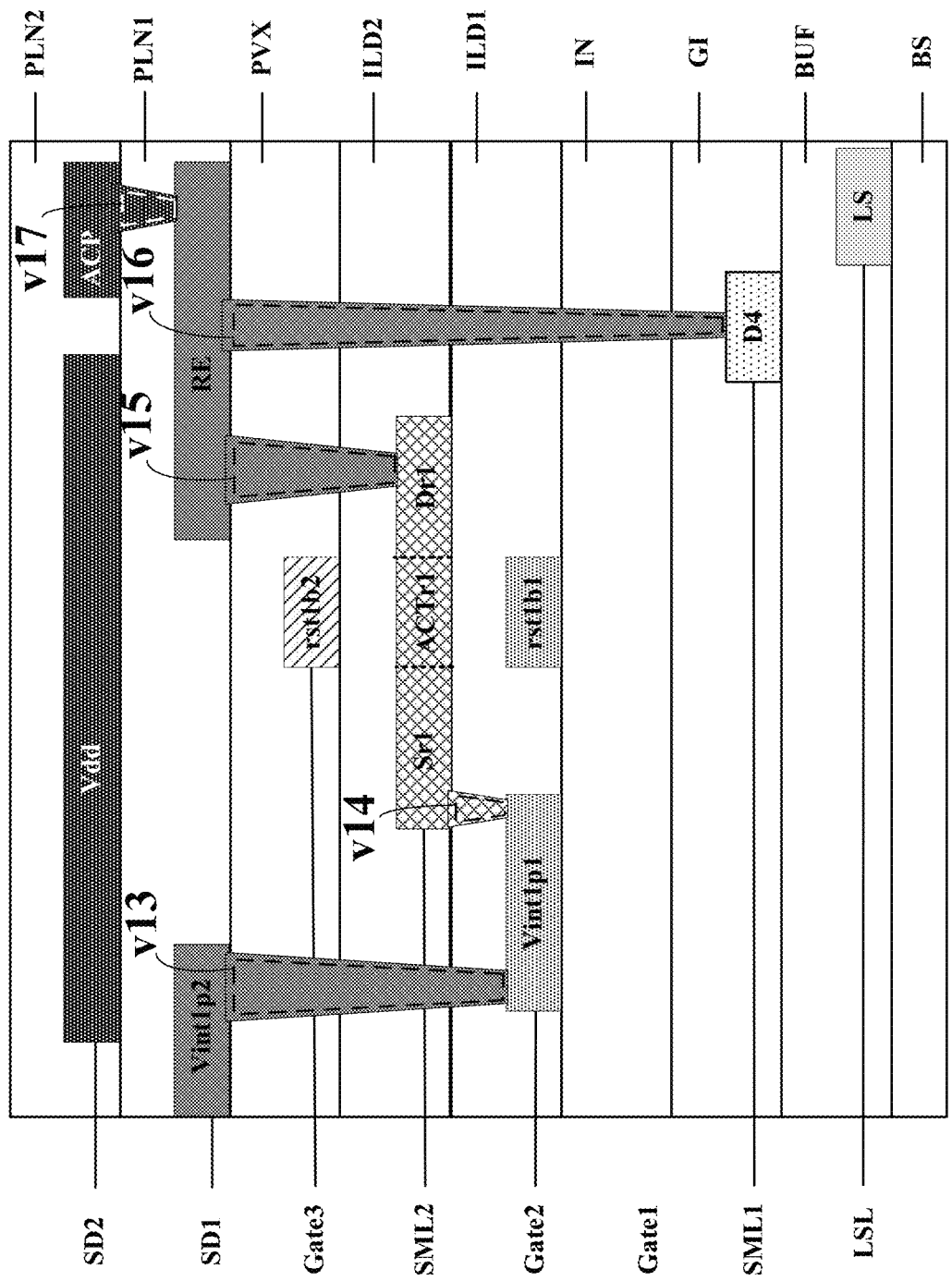
FIG. 4D is a cross-sectional view along a D-D' line in FIG. 3A.
Figure 4E:
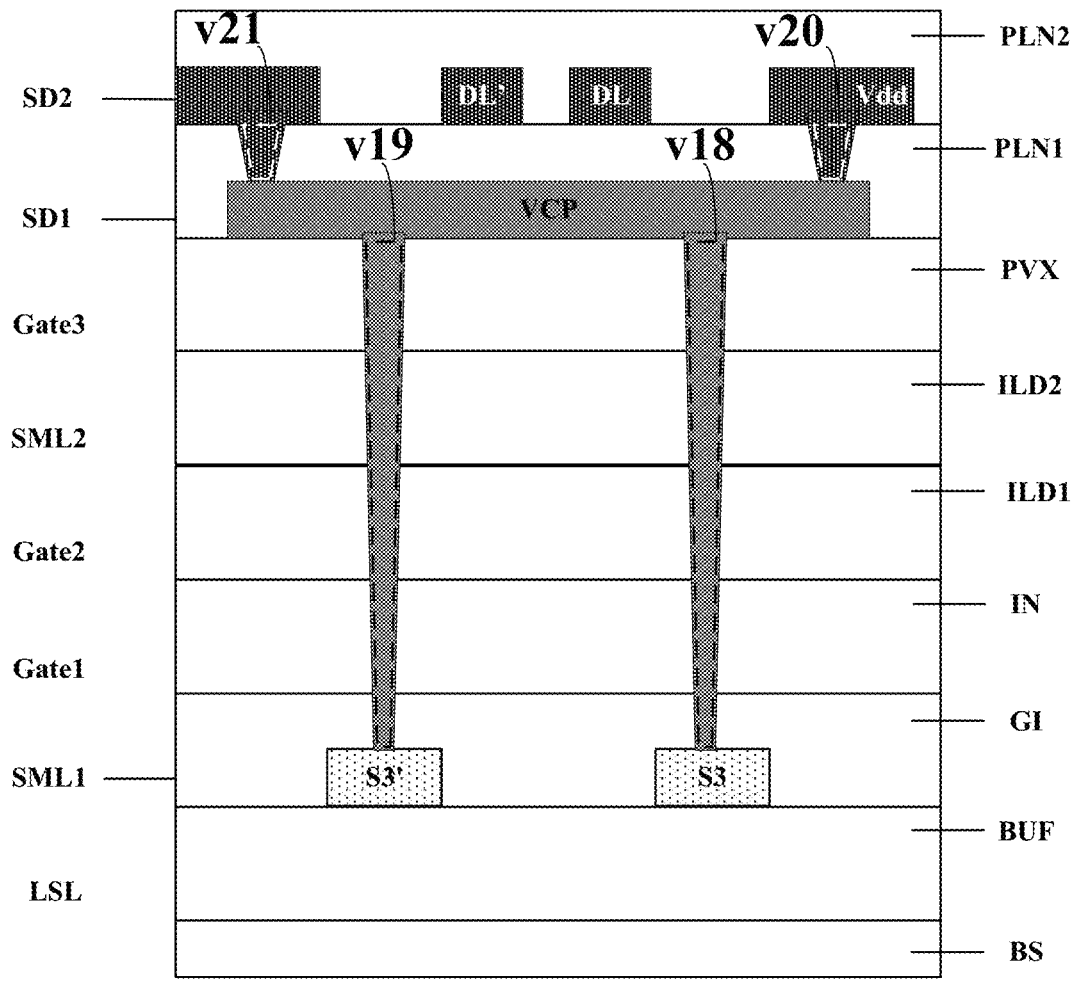
FIG. 4E is a cross-sectional view along a E-E' line in FIG. 3A.

FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along an E-E' line in FIG. 3A.

Referring to FIG. 3A to FIG. 3N, and FIG. 4A to FIG. 4E, the array substrate in some embodiments includes a base substrate BS, a light shield layer LSL on the base substrate BS, a buffer layer BUF on a side of the light shield layer LSL away from the base substrate BS, a first semiconductor material layer SML1 on a side of the buffer layer BUF away from the base substrate BS, a gate insulating layer GI on a side of the first semiconductor material layer SML1 away from the base substrate BS, a first gate metal layer Gate1 on a side of the gate insulating layer GI away from the first semiconductor material layer SML1, an insulating layer IN on a side of the first gate metal layer Gate1 away from the gate insulating layer GI, a second gate metal layer Gate2 on a side of the insulating layer IN away from the first gate metal layer Gate1, a first inter-layer dielectric layer ILD1 on a side of the second gate metal layer Gate2 away from the insulating layer IN, a second semiconductor material layer SML2 on a side of the first inter-layer dielectric layer ILD1 away from the second gate metal layer Gate2, a second inter-layer dielectric layer ILD2 on a side of the second semiconductor material layer SML2 away from the first inter-layer dielectric layer ILD1, a third gate metal layer Gate3 on a side of the second inter-layer dielectric layer ILD2 away from the second semiconductor material layer SML2, a passivation layer PVX on a side of the third gate metal layer Gate3 away from the second inter-layer dielectric layer ILD2, a first signal line layer SD1 on a side of the passivation layer PVX away from the third gate metal layer Gate3, a first planarization layer PLN1 on a side of the first signal line layer SD1 away from the passivation layer PVX, a second signal line layer SD2 on a side of the first planarization layer PLN1 away from the first signal line layer SD1, and a second planarization layer PLN2 on a side of the second signal line layer SD2 away from the first planarization layer PLN1.

Referring to FIG. 2A, FIG. 3A, FIG. 3C, FIG. 4A, FIG. 4B, and FIG. 4D, in some embodiments, the light shield layer LSL includes a light shield LS. Various appropriate materials and various appropriate fabricating methods may be used for making the light shield layer LSL. For example, a metallic material may be deposited on the substrate by a plasma-enhanced chemical vapor deposition (PECVD) process. Examples of appropriate metallic materials for making the light shield layer LSL include, but are not limited to, aluminum, chromium, tungsten, titanium, tantalum, molybdenum, copper, and alloys or laminates containing the same.

Referring to FIG. 2A, FIG. 3A, FIG. 3D, FIG. 4A to FIG. 4E, the first semiconductor material layer SML1 in some embodiments includes at least active layers of multiple transistors of the pixel driving circuit, including the first transistor T1, the third transistor T3, the fourth transistor T4, the second reset transistor Tr2, and the driving transistor Td. Optionally, the first semiconductor material layer SML1 further includes at least respective portions of first electrodes of multiple transistors of the pixel driving circuit, including the first transistor T1, the third transistor T3, the fourth transistor T4, the second reset transistor Tr2, and the driving transistor Td. Optionally, the first semiconductor material layer SML1 further includes at least respective portions of second electrodes of multiple transistors of the pixel driving circuit, including the first transistor T1, the third transistor T3, the fourth transistor T4, the second reset transistor Tr2, and the driving transistor Td. Optionally, the first semiconductor material layer SML1 includes active layers, first electrodes, and second electrodes of multiple transistors of the pixel driving circuit, including the first transistor T1, the third transistor T3, the fourth transistor T4, the second reset transistor Tr2, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon, single-crystal silicon, and amorphous silicon.

In FIG. 3D, a pixel driving circuit corresponding to PDC2 in FIG. 3B is annotated with labels indicating components of each of multiple transistors (T1, T3, T4, Tr2, and Td) in the pixel driving circuit. For example, the first transistor T1 includes an active layer ACT1, a first electrode S1, and a second electrode D1. The third transistor T3 includes an active layer ACT3, a first electrode S3, and a second electrode D3. The fourth transistor T4 includes an active layer ACT4, a first electrode S4, and a second electrode D4. The second reset transistor Tr2 includes an active layer ACTr2, a first electrode Sr2, and a second electrode Dr2. The driving transistor Td includes an active layer ACTd, a first electrode Sd, and a second electrode Dd.

Optionally, the active layers (ACT1, ACT3, ACT4, ACTr2, and ACTd), the first electrodes (S1, S3, S4, Sr2, and Sd), and the second electrodes (D1, D3, D4, Dr2, and Dd) of the respective transistors (T1, T3, T4, Tr2, and Td) are in a same layer.

In some embodiments, the active layers (ACT3, ACTr2, and ACTd), at least portions of the first electrodes (S3, Sr2, and Sd), and at least portions of the second electrodes (D3, Dr2, and Dd) of multiple transistors (T3, Tr2, and Td) in the pixel driving circuit are parts of a unitary structure. Optionally, a part of the first transistor T1 in the first semiconductor material layer is spaced apart from the unitary structure (T3, Tr2, and Td) in a same pixel driving circuit. Optionally, a part of the fourth transistor T4 in the first semiconductor material layer is spaced apart from the unitary structure (T3, Tr2, and Td) in a same pixel driving circuit.

Referring to FIG. 2A, FIG. 3A, FIG. 3E, FIG. 4A to FIG. 4E, the first gate metal layer Gate1 in some embodiments includes a plurality of first gate lines (e.g., a respective first gate line GL1), a plurality of second reset control signal lines (e.g., a respective second reset control signal line rst2), a plurality of first light emitting control signal lines (e.g., a respective first light emitting control signal line EM1), a plurality of second light emitting control signal lines (e.g., a respective second light emitting control signal line EM2), and a first capacitor electrode Ce1 of the storage capacitor Cst. Various appropriate electrode materials and various appropriate fabricating methods may be used to make the first gate metal layer Gate1. For example, a conductive material may be deposited on the substrate by a plasma-enhanced chemical vapor deposition (PECVD) process and patterned. Examples of appropriate conductive materials for making the first gate metal layer Gate1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first gate lines, the plurality of second reset control signal lines, the plurality of first light emitting control signal lines, the plurality of second light emitting control signal lines, and the first capacitor electrode Ce1 are in a same layer.

As used herein, the term "same layer" refers to the relationship between the layers simultaneously formed in the same step. In one example, the plurality of first gate lines and the first capacitor electrode Ce1 are in a same layer when they are formed as a result of one or more steps of a same patterning process performed in a same layer of material. In another example, the plurality of first gate lines and the first capacitor electrode Ce1 can be formed in a same layer by simultaneously performing the step of forming the plurality of first gate lines, and the step of forming the first capacitor electrode Ce1. The term "same layer" does not always mean that the thickness of the layer or the height of the layer in a cross-sectional view is the same.

Referring to FIG. 2A, FIG. 3A, FIG. 3F, FIG. 4A to FIG. 4E, the second gate metal layer Gate2 in some embodiments includes at least portions of a plurality of second gate lines (e.g., a respective second gate line first branch GL2b1), at least portions of a plurality of first reset control signal lines (e.g., a respective first reset control signal line first branch rst1b1), at least portions of a plurality of first reset signal lines (e.g., a respective first reset signal line first portion Vint1p1), and a second capacitor electrode Ce2 of the storage capacitor Cst. Various appropriate electrode materials and various appropriate fabricating methods may be used to make the second gate metal layer Gate2. For example, a conductive material may be deposited on the substrate by a plasma-enhanced chemical vapor deposition (PECVD) process and patterned. Examples of appropriate conductive materials for making the second gate metal layer Gate2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the respective second gate line first branch GL2b1, the respective first reset control signal line first branch rst1b1, the respective first reset signal line first portion Vint1p1, and the second capacitor electrode are in a same layer.

Vias extending through the first inter-layer dielectric layer ILD1 are depicted in FIG. 3G.

Referring to FIG. 2A, FIG. 3A, FIG. 3H, FIG. 4A to FIG. 4E, the second semiconductor material layer SML2 in some embodiments includes at least an active layer of the second transistor T2 and at least an active layer of the first reset transistor Tr1. Optionally, the second semiconductor material layer SML2 further includes at least a portion of a first electrode of the second transistor T2. Optionally, the second semiconductor material layer SML2 further includes at least a portion of a second electrode of the second transistor T2. Optionally, the second semiconductor material layer SML2 further includes at least a portion of a first electrode of the first reset transistor Tr1. Optionally, the second semiconductor material layer SML2 further includes at least a portion of a second electrode of the first reset transistor Tr1. Optionally, the second semiconductor material layer SML2 includes the active layer, the first electrode, and the second electrode of the second transistor T2. Optionally, the second semiconductor material layer SML2 includes the active layer, the first electrode, and the second electrode of the first reset transistor Tr1. In the present array substrate, at least the active layers of the second transistor T2 and the first reset transistor Tr1 are in a layer different from at least the active layers of other transistors of the pixel driving circuit. Various appropriate semiconductor materials may be used for making the second semiconductor material layer SML2. Examples of the semiconductor materials for making the second semiconductor material layer SML2 include metal oxide-based semiconductor material such as indium gallium zinc oxide and metal oxynitride-based semiconductor materials such as zinc oxynitride.

In FIG. 3H, a pixel driving circuit corresponding to PDC2 in FIG. 3B is annotated with labels indicating components of the second transistor T2 and the first reset transistor Tr1 in the pixel driving circuit. For example, the second transistor T2 includes an active layer ACT2, a first electrode S2, and a second electrode D2; and the first reset transistor Tr1 includes an active layer ACTr1, a first electrode Sr1, and a second electrode Dr1. Optionally, the active layer ACT2, the first electrode S2, and the second electrode D2 of the second transistor T2 are in a same layer. Optionally, the active layer ACTr1, the first electrode Sr1, and the second electrode Dr1 of the first reset transistor Tr1 are in a same layer.

Vias extending through the second inter-layer dielectric layer ILD2 are depicted in FIG. 3I.

Referring to FIG. 2A, FIG. 3A, FIG. 3J, FIG. 4A to FIG. 4E, the third gate metal layer Gate3 in some embodiments includes at least portions of a plurality of second gate lines (e.g., a respective second gate line second branch GL2b2), a plurality of second reset signal lines (e.g., a respective second reset signal line Vint2), and at least portions of a plurality of first reset control signal lines (e.g., a respective first reset control signal line second branch rst1b2). Various appropriate electrode materials and various appropriate fabricating methods may be used to make the third gate metal layer Gate3. For example, a conductive material may be deposited on the substrate by a plasma-enhanced chemical vapor deposition (PECVD) process and patterned. Examples of appropriate conductive materials for making the third gate metal layer Gate3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Vias extending through the passivation layer PVX are depicted in FIG. 3K.

Referring to FIG. 2A, FIG. 3A, FIG. 3L, FIG. 4A to FIG. 4E, the first signal line layer SD1 in some embodiments includes at least portions of a plurality of first reset signal lines (e.g., a respective first reset signal line second portion Vint1$p$2), a voltage connecting pad VCP, a relay electrode RE, a node connecting line Cln, a first connecting line Cl1, a second connecting line Cl2, a third connecting line C13, and an initialization connecting line Cli. Various appropriate conductive materials and various appropriate fabricating methods may be used to make the first signal line layer SD1. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the respective first reset signal line second portion Vint1$p$2, the voltage connecting pad VCP, the relay electrode RE, the node connecting line Cln, the first connecting line Cl1, the second connecting line Cl2, the third connecting line C13, and the initialization connecting line Cli are in a same layer.

In some embodiments, the node connecting line Cln connects various components of the pixel driving circuit to the node N1. Referring to FIG. 4A, the node connecting line Cln is connected to the first capacitor electrode Ce1 through a first via v1, and connected to the second transistor T2 (e.g., to the first electrode S2 of the second transistor T2) through a second via v2. Optionally, the node connecting line Cln corresponds to the node N1 depicted in FIG. 2A.

Referring to FIG. 2A, FIG. 3A, FIG. 3D, FIG. 3F, FIG. 4A, in some embodiments, in a hole region H, a portion of the second capacitor electrode Ce2 is absent. Optionally, an orthographic projection of the second capacitor electrode Ce2 on a base substrate BS substantially (e.g., at least 80%, at least 85%, at least 90%, at least 95%, at least 98%, at least 99%, or 100%) covers, with a margin, an orthographic projection of the first capacitor electrode Ce1 on the base substrate BS except for the hole region H in which a portion of the second capacitor electrode Ce2 is absent. Optionally, the first via v1 extends through the passivation layer PVX, the second inter-layer dielectric layer ILD2, the first inter-layer dielectric layer ILD1, the hole region H, and the insulating layer IN.

In some embodiments, the node connecting line Cln crosses over the respective second gate line GL2. As shown in FIG. 3A and FIG. 4A, the node connecting line Cln crosses over the respective second gate line first branch GL2$b$1 in the second gate metal layer Gate2, and the respective second gate line second branch GL2$b$2 in the third gate metal layer Gate3.

Vias extending through the first planarization layer PLN1 are depicted in FIG. 3M.

Referring to FIG. 2A, FIG. 3A, FIG. 3N, FIG. 4A to FIG. 4E, the second signal line layer SD2 in some embodiments includes a plurality of voltage supply lines (e.g., the respective voltage supply line Vdd), a plurality of data lines (e.g., the respective data line DL), and an anode contact pad ACP. Various appropriate conductive materials and various appropriate fabricating methods may be used to make the second signal line layer SD2. For example, a conductive material may be deposited on the substrate by a plasma-enhanced chemical vapor deposition (PECVD) process and patterned. Examples of appropriate conductive materials for making the second signal line layer SD2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines (e.g., the respective voltage supply line Vdd), the plurality of data lines (e.g., the respective data line DL), and the anode contact pad ACP are in a same layer.

In some embodiments, the respective second gate line GL2 includes the respective second gate line first branch GL2$b$1 and the respective second gate line second branch GL2$b$2 in two different layers. Optionally, the respective second gate line first branch GL2$b$1 is in the second gate metal layer Gate2, and the respective second gate line second branch GL2$b$2 is in the third gate metal layer Gate3. As shown in FIG. 3A, FIG. 3F, FIG. 3J, FIG. 4A, and FIG. 4B, in some embodiments, an orthographic projection of the respective second gate line first branch GL2$b$1 on a base substrate BS at least partially overlaps with an orthographic projection of the respective second gate line second branch GL2$b$2 on the base substrate BS. Optionally, the respective second gate line first branch GL2$b$1 and the respective second gate line second branch GL2$b$2 are configured to be provided with a same gate scanning signal.

In some embodiments, the respective first reset control signal line rst1 includes the respective first reset control signal line first branch rst1$b$1 and the respective first reset control signal line second branch rst1$b$2. Optionally, the respective first reset control signal line first branch rst1$b$1 is in the second gate metal layer Gate2, and the respective first reset control signal line second branch rst1$b$2 is in the third gate metal layer Gate3. As shown in FIG. 3A, FIG. 3F, FIG. 3J, and FIG. 4D, in some embodiments, an orthographic projection of the respective first reset control signal line first branch rst1$b$1 on a base substrate BS at least partially overlaps with an orthographic projection of the respective first reset control signal line second branch rst1$b$2 on the base substrate BS. Optionally, the respective first reset control signal line first branch rst1$b$1 and the respective first reset control signal line second branch rst1$b$2 are configured to be provided with a same reset control signal.

In some embodiments, the respective first reset signal line Vint1 includes a plurality of first portions (e.g., the respective first reset signal line first portion Vint1$p$1) and a plurality of second portions (e.g., the respective first reset signal line second portion Vint1$p$2) alternately arranged and connected together. Optionally, the plurality of first portions (e.g., the respective first reset signal line first portion Vint1$p$1) are in the second gate metal layer Gate2. Optionally, the plurality of second portions (e.g., the respective first reset signal line second portion Vint1$p$2) are in the first signal line layer SD1.

In some embodiments, an orthographic projection of the respective second reset control signal line rst2 of the plurality of second control signal lines on a base substrate BS at least partially overlaps with an orthographic projection of the respective second reset signal line Vint2 of the plurality of second reset signal lines on the base substrate BS. Optionally, the respective second reset control signal line rst2 is in the first gate metal layer Gate1. Optionally, the respective second reset signal line Vint2 is in the third gate metal layer Gate3.

Referring to FIG. 4A, the initialization connecting line Cli in some embodiments connects to the first electrode Sr2 of the second reset transistor through a third via v3, and connects to the respective second reset signal line Vint2 through a fourth via v4. Optionally, the third via v3 extends through the passivation layer PVX, the second inter-layer dielectric layer ILD2, the first inter-layer dielectric layer ILD1, the insulating layer IN, and the gate insulating layer GI. Optionally, the fourth via v4 extends through the passivation layer PVX. The initialization connecting line Cli is configured to transmit a second reset signal from the respective second reset signal line Vint2 to the first electrode Sr2 of the second reset transistor.

Referring to FIG. 4B, the third connecting line C13 in some embodiments connects to the second electrode D2 of the second transistor through a fifth via v5, connects to the second electrode Dr2 of the second reset transistor through a sixth via v6, and connects to the first electrode S4 of the fourth transistor through a seventh via v7. Optionally, the fifth via v5 extends through the passivation layer PVX and the second inter-layer dielectric layer ILD2. Optionally, the sixth via v6 extends through the passivation layer PVX, the second inter-layer dielectric layer ILD2, the first inter-layer dielectric layer ILD1, the insulating layer IN, and the gate insulating layer GI. Optionally, the seventh via v7 extends through the passivation layer PVX, the second inter-layer dielectric layer ILD2, the first inter-layer dielectric layer ILD1, the insulating layer IN, and the gate insulating layer GI. Optionally, the third connecting line C13 corresponds to the node N3 as depicted in FIG. 2A.

As shown in FIG. 3A and FIG. 4B, the third connecting line C13 crosses over the respective second reset signal line Vint2 in the third gate metal layer Gate3, the respective first reset control signal line second branch rst1$b$2 in the third gate metal layer Gate3, the respective first reset signal line first portion Vint1$p$1 in the second gate metal layer Gate2, the respective first reset control signal line first branch rst1$b$1 in the second gate metal layer Gate2, the respective second reset control signal line rst2 in the first gate metal layer Gate1, the respective first gate line GL1 in the first gate metal layer Gate1, and the respective first light emitting control signal line EM1 in the first gate metal layer Gate1.

Referring to FIG. 4C, the voltage connecting pad VCP in some embodiments connects to the second capacitor electrode Ce2 of the storage capacitor though an eighth via v8. Optionally, the eighth via v8 extends through the passivation layer PVX, the second inter-layer dielectric layer ILD2, and the first inter-layer dielectric layer ILD1. Referring to FIG. 4E, the voltage connecting pad VCP in some embodiments further connects to the first electrode S3 of the third transistor through an eighteenth via v18. Optionally, the voltage connecting pad VCP further connects to the first electrode S3' of the third transistor in an adjacent pixel driving circuit through a nineteenth via v19. Optionally, the eighteenth via v18 extends through the passivation layer PVX, the second inter-layer dielectric layer ILD2, the first inter-layer dielectric layer ILD1, the insulating layer IN, and the gate insulating layer GI. Optionally, the nineteenth via v19 extends through the passivation layer PVX, the second inter-layer dielectric layer ILD2, the first inter-layer dielectric layer ILD1, the insulating layer IN, and the gate insulating layer GI.

In some embodiments, the respective voltage supply line Vdd connects to the voltage connecting pad VCP through at least one of a twentieth via v20 and a twenty first via v21. Optionally, the twentieth via v20 extends through the first planarization layer PLN1. Optionally, the twenty first via v21 extends through the first planarization layer PLN1.

As shown in FIG. 3A and FIG. 4E, the respective data line DL and a respective data line DL' in an adjacent pixel driving circuit cross over the voltage connecting pad VCP.

Referring to FIG. 4C, the first connecting line C11 in some embodiments connects to the first electrode Sd of the driving transistor through a ninth via v9, and connects to the second electrode D1 of the first transistor through a tenth via v10. Optionally, the ninth via v9 extends through the passivation layer PVX, the second inter-layer dielectric layer ILD2, the first inter-layer dielectric layer ILD1, the insulating layer IN, and the gate insulating layer GI. Optionally, the tenth via v10 extends through the passivation layer PVX, the second inter-layer dielectric layer ILD2, the first inter-layer dielectric layer ILD1, the insulating layer IN, and the gate insulating layer GI.

As shown in FIG. 3A and FIG. 4C, the first connecting line C11 crosses over the respective second reset signal line Vint2, and crosses over the respective second reset control signal line rst2. Optionally, an orthographic projection of the respective data line DL on the base substrate BS at least partially overlaps with an orthographic projection of the first connecting line C11 on the base substrate BS.

Referring to FIG. 4C, the respective data line DL connects to the second connecting line C12 through an eleventh via v11, and the second connecting line C12 connects to the first electrode S1 of the first transistor through a twelfth via v12. The second connecting line C12 is configured to transmit data signals from the respective data line DL to the first electrode S1 of the first transistor. Optionally, the eleventh via v11 extends through the first planarization layer PLN1. Optionally, the twelfth via v12 extends through the passivation layer PVX, the second inter-layer dielectric layer ILD2, the first inter-layer dielectric layer ILD1, the insulating layer IN, and the gate insulating layer GI. Optionally, an orthographic projection of the respective data line DL on the base substrate BS at least partially overlaps with an orthographic projection of the second connecting line C12 on the base substrate BS.

Figure 5:
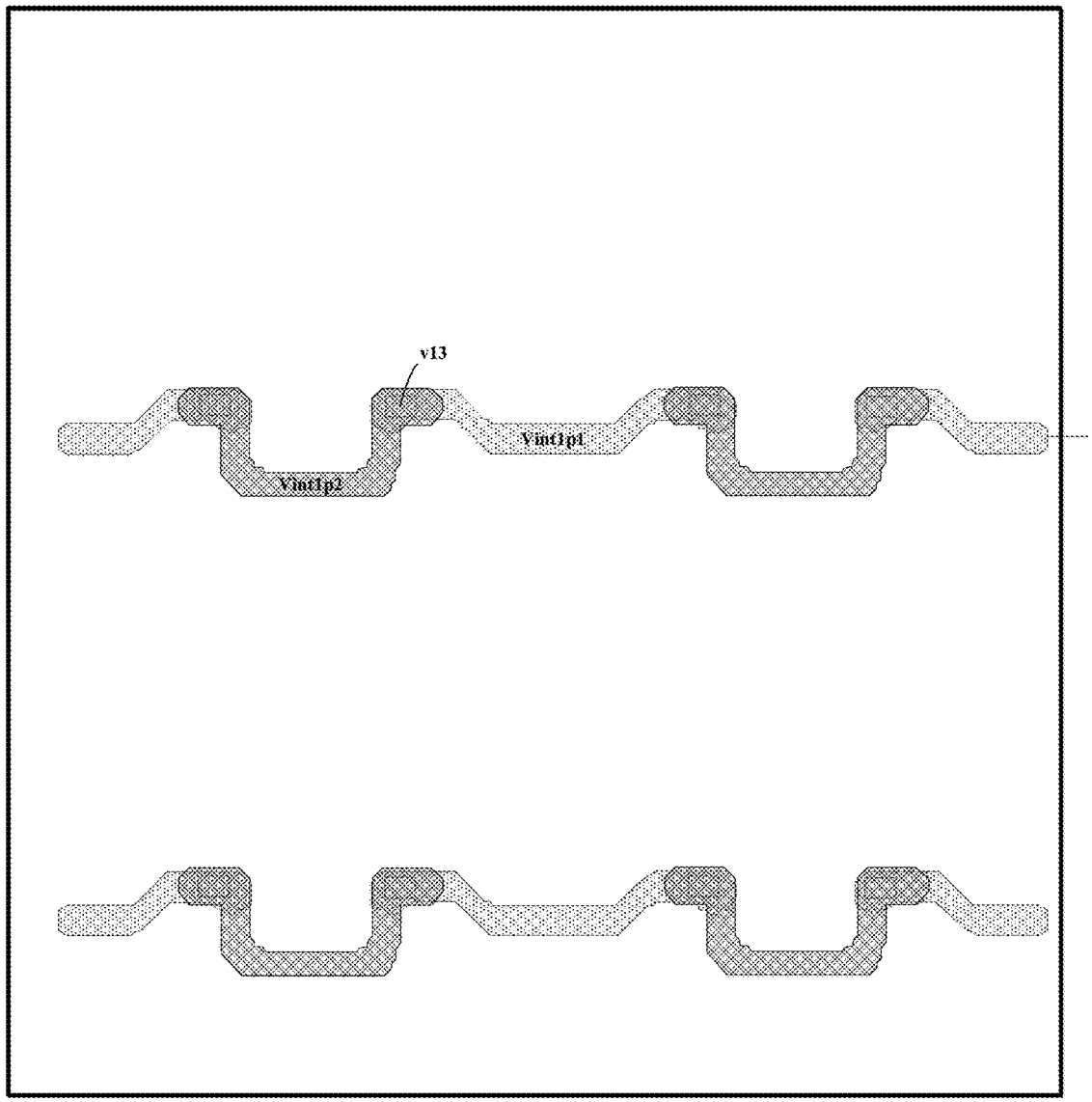
FIG. 5 is a superimposition of a plurality of first portions and a plurality of second portions of a respective first reset signal line in some embodiments according to the present disclosure.

FIG. 5 is a superimposition of a plurality of first portions and a plurality of second portions of a respective first reset signal line in some embodiments according to the present disclosure. Referring to FIG. 4D and FIG. 5, the respective first reset signal line second portion Vint1$p$2 in some embodiments connects to the respective first reset signal line first portion Vint1$p$1 through a thirteenth via v13. Optionally, the thirteenth via v13 extends through the passivation layer PVX, the second inter-layer dielectric layer ILD2, and the first inter-layer dielectric layer ILD1. The first electrode Sr1 of the first reset transistor Tr1 connects to respective first reset signal line first portion Vint1$p$1 through a fourteenth via v14. Optionally, the fourteenth via v14 extends through the first inter-layer dielectric layer ILD1.

Referring to FIG. 4D, the relay electrode RE in some embodiments connects to the second electrode Dr1 of the first reset transistor through a fifteenth via v15, and connects to the second electrode D4 of the fourth transistor through a sixteenth via v16. Optionally, the fifteenth via v15 extends through the passivation layer PVX and the second inter-layer dielectric layer ILD2. Optionally, the sixteenth via v16 extends through the passivation layer PVX, the second inter-layer dielectric layer ILD2, the first inter-layer dielectric layer ILD1, the insulating layer IN, and the gate insulating layer GI. The anode connecting pad ACP connects to the relay electrode RE through a seventeenth via v17. Optionally, the seventeenth via v17 extends through the first planarization layer PLN1. The relay electrode RE and/or the anode connecting pad ACP corresponds to the node N4.

Figure 6A:
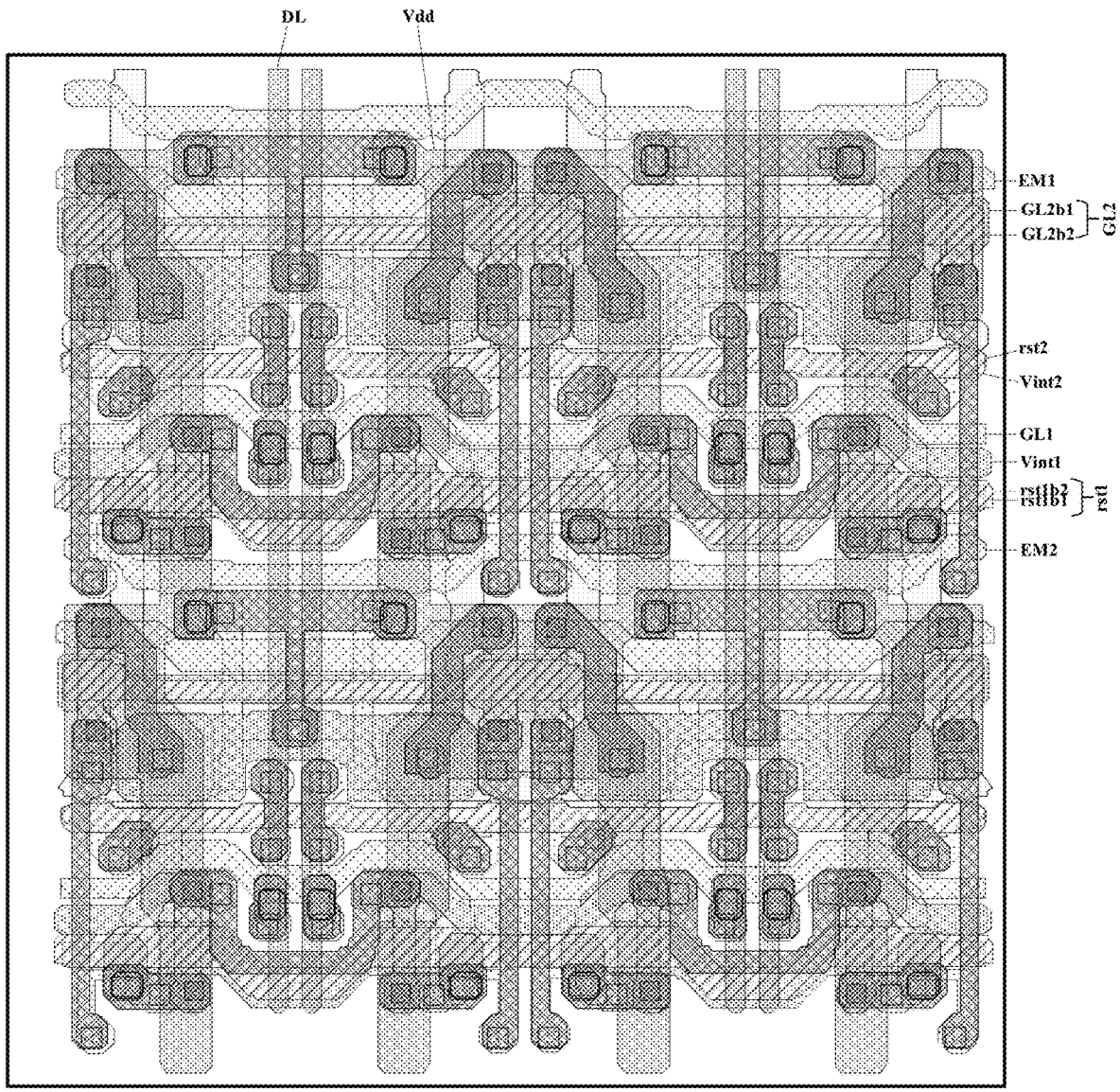
FIG. 6A is a diagram illustrating the structure of pixel driving circuits in an array substrate in some embodiments according to the present disclosure.
Figure 6B:
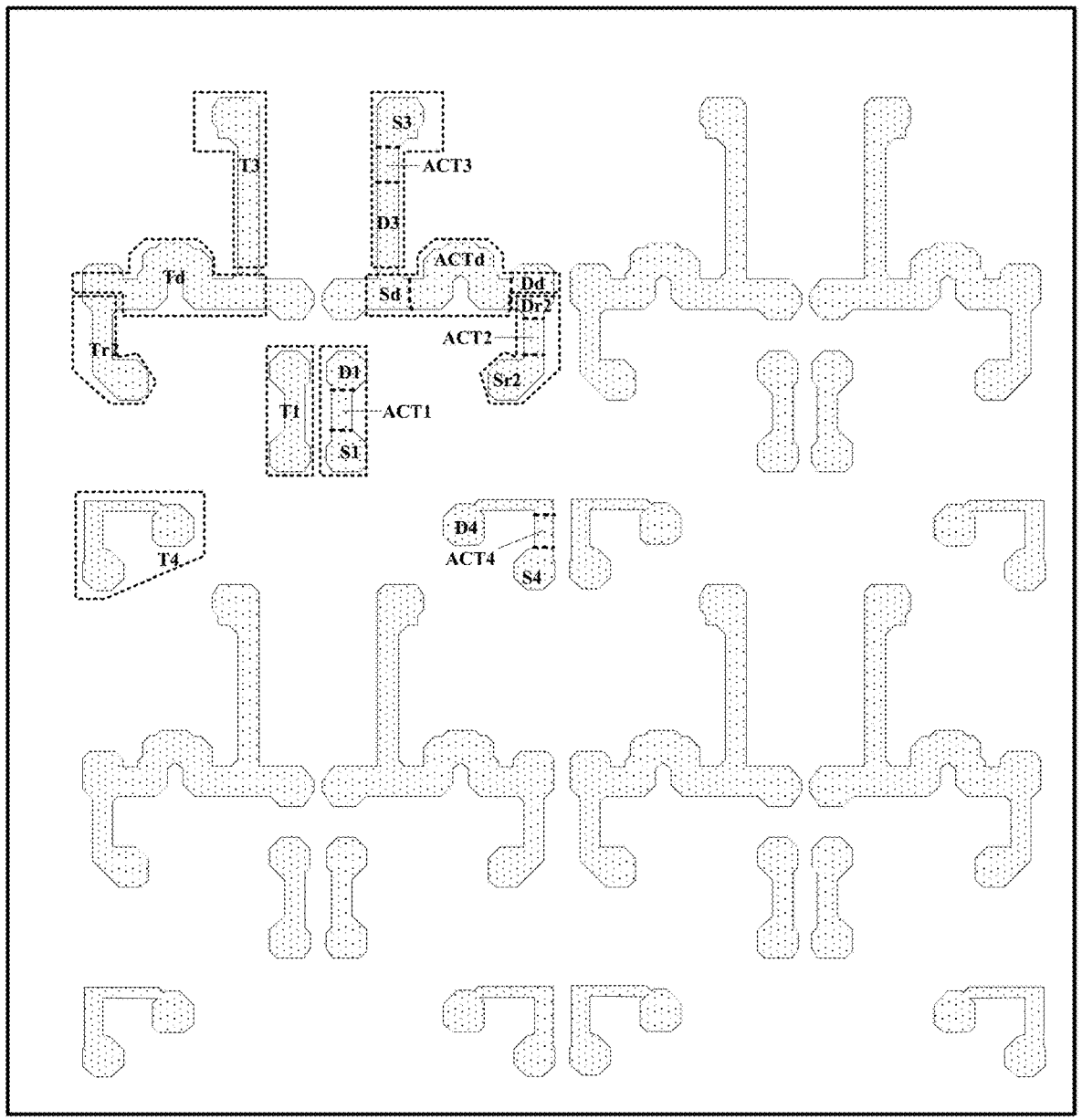
FIG. 6B is a diagram illustrating the structure of a first semiconductor material layer in the array substrate depicted in FIG. 6A.
Figure 6C:
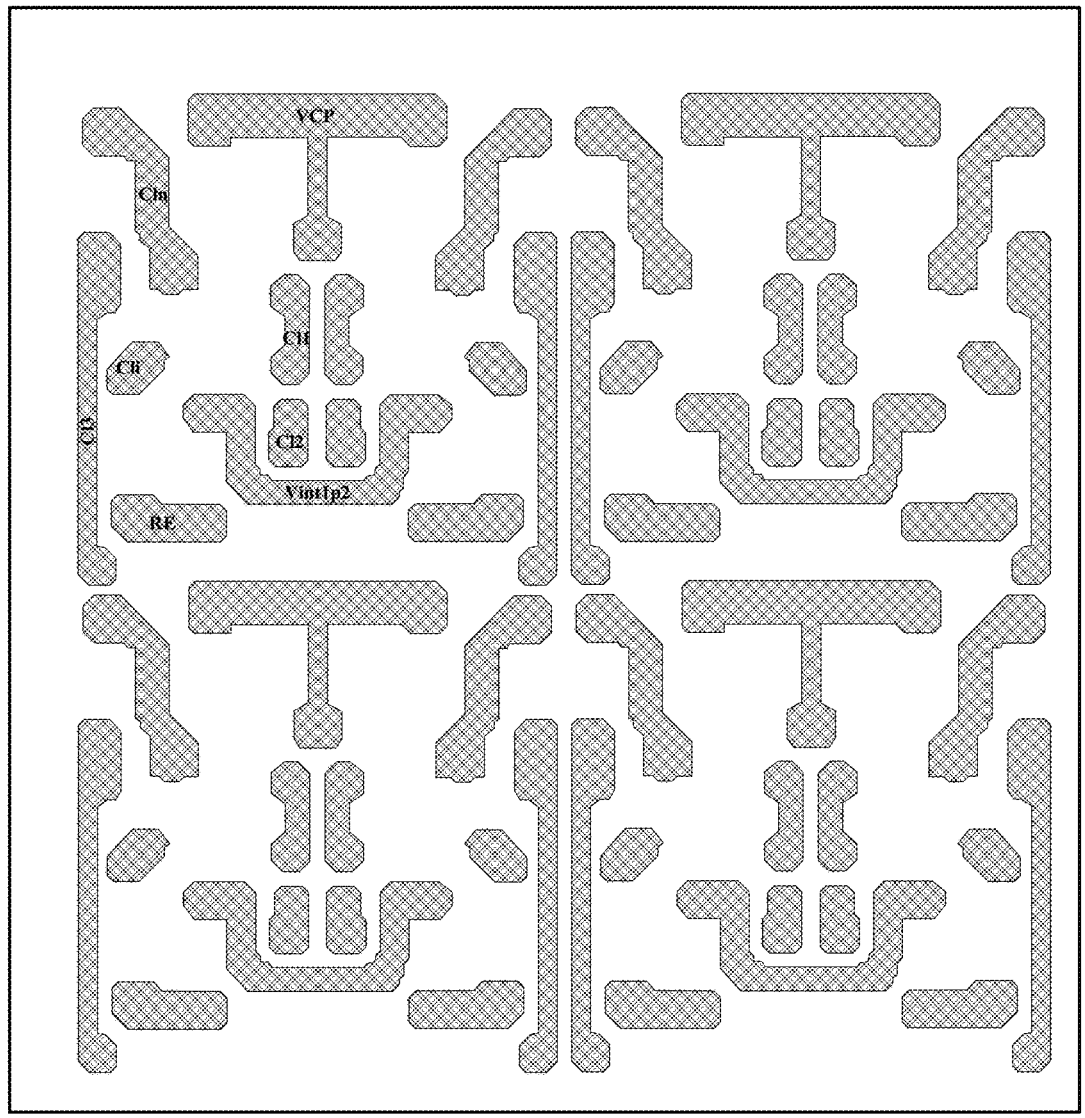
FIG. 6C is a diagram illustrating the structure of a first signal line layer in the array substrate depicted in FIG. 6A.
Figure 6D:
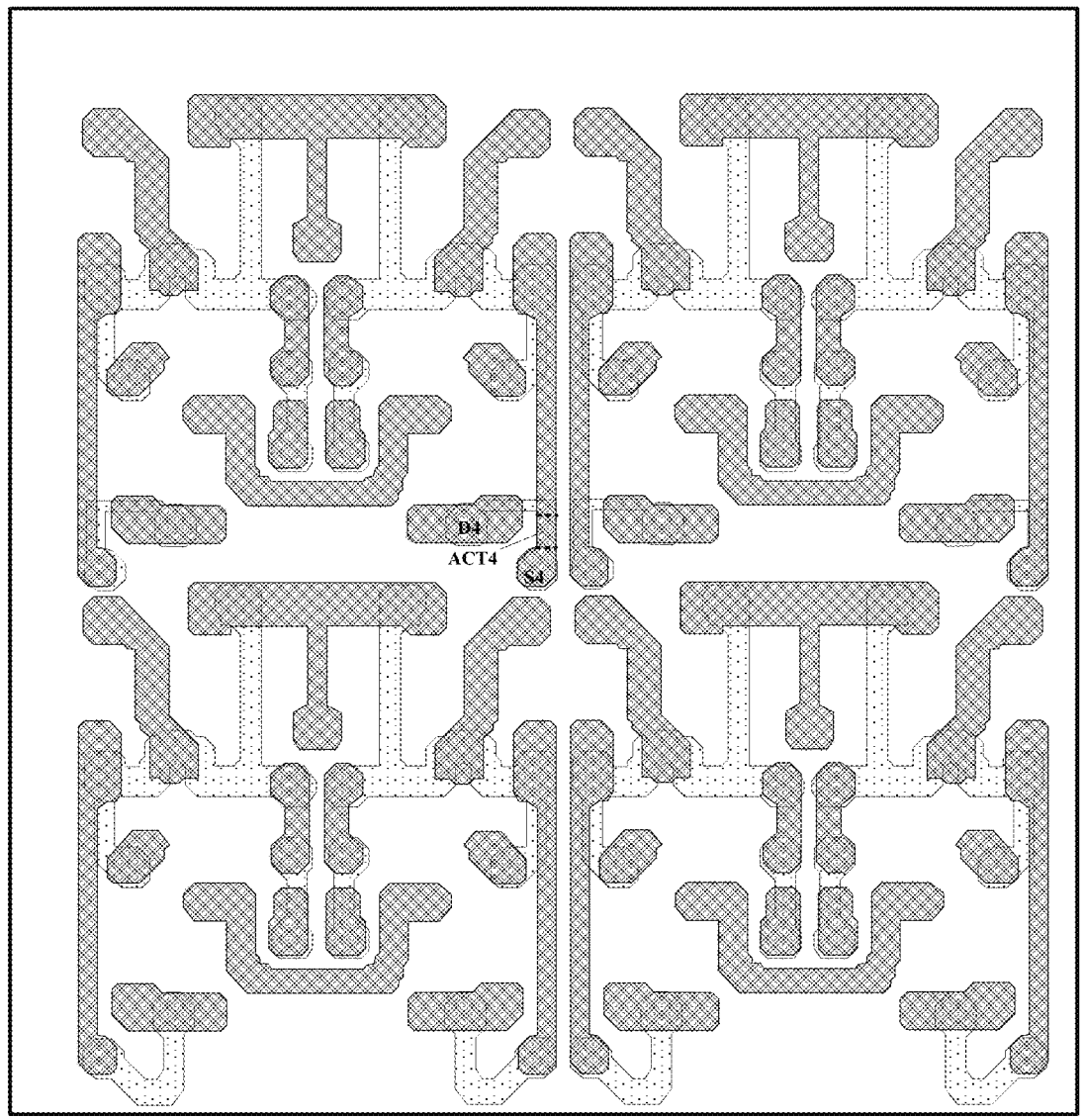
FIG. 6D is a diagram illustrating the structure of a first semiconductor material layer and a first signal line layer in the array substrate depicted in FIG. 6A.

FIG. 6A is a diagram illustrating the structure of pixel driving circuits in an array substrate in some embodiments according to the present disclosure. FIG. 6B is a diagram illustrating the structure of a first semiconductor material layer in the array substrate depicted in FIG. 6A. FIG. 6C is a diagram illustrating the structure of a first signal line layer in the array substrate depicted in FIG. 6A. FIG. 6D is a diagram illustrating the structure of a first semiconductor material layer and a first signal line layer in the array substrate depicted in FIG. 6A. The array substrate depicted in FIG. 6A to FIG. 6D differs from the array substrate depicted in FIG. 3A to FIG. 3N in that the layouts of the fourth transistor T4 are different. The structures of layers other than the first semiconductor material layers in the array substrate depicted in FIG. 6A to FIG. 6D and the array substrate depicted in FIG. 3A to FIG. 3N are substantially the same.

In the array substrate depicted in FIG. 3A to FIG. 3N, the first electrode S4 of the fourth transistor T4 extends in a space between the respective second light emitting control signal line EM2 and a respective first light emitting control signal line in the next row. In the layout of the fourth transistor T4, an orthographic projection of the fourth transistor T4 on a base substrate is non-overlapping with an orthographic projection of the respective first light emitting control signal line in the next row on the base substrate, to reduce the channel length of the fourth transistor T4.

In the array substrate depicted FIG. 6A to FIG. 6D, an orthographic projection of the active layer ACT4 of the fourth transistor T4 on a base substrate at least partially overlaps with an orthographic projection of the third connecting line C13 on the base substrate. By having this layout, the channel length of the fourth transistor T4 can also be reduced.

Figure 7A:
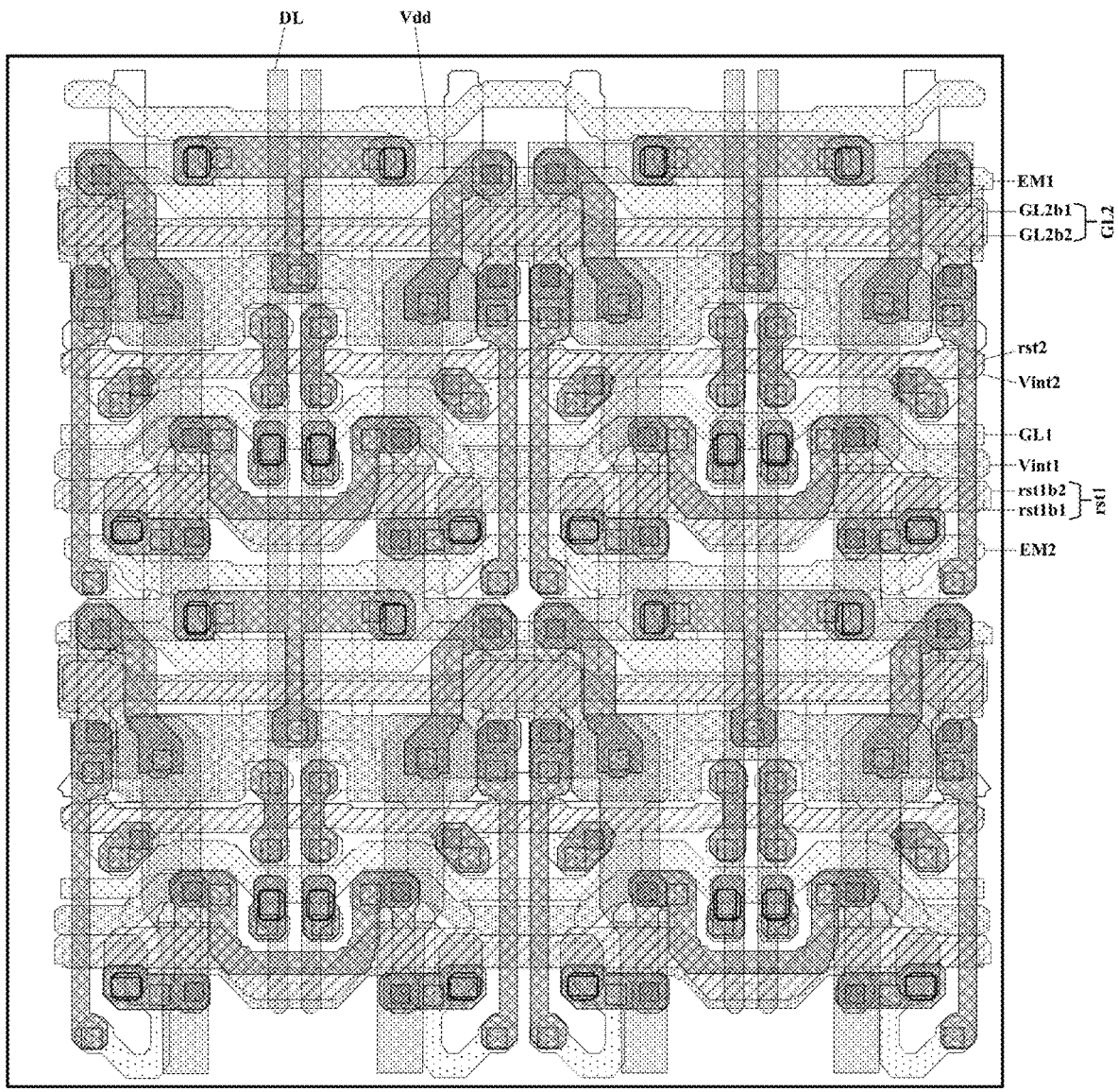
FIG. 7A is a diagram illustrating the structure of pixel driving circuits in an array substrate in some embodiments according to the present disclosure.
Figure 7B:
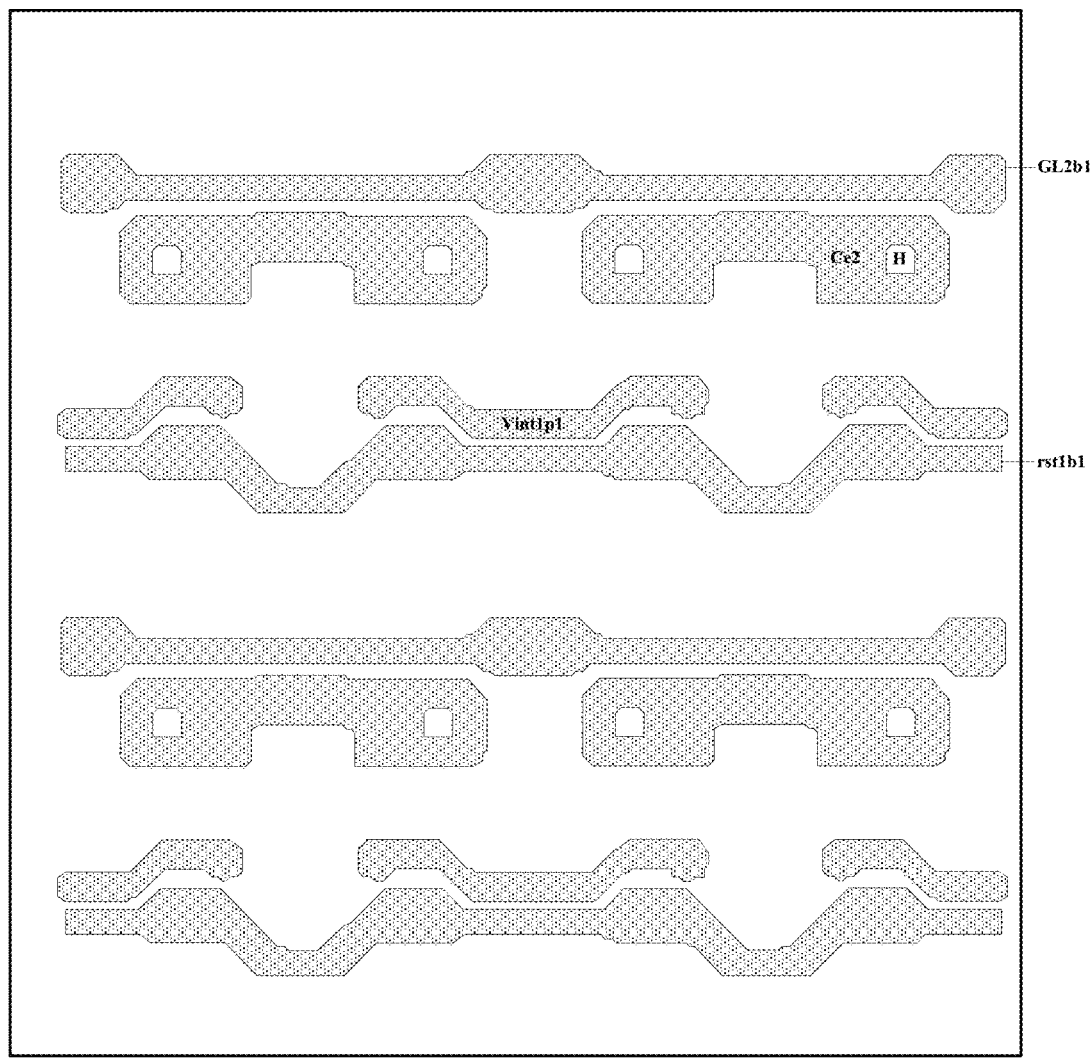
FIG. 7B is a diagram illustrating the structure of a second gate metal layer in the array substrate depicted in FIG. 7A.
Figure 7C:
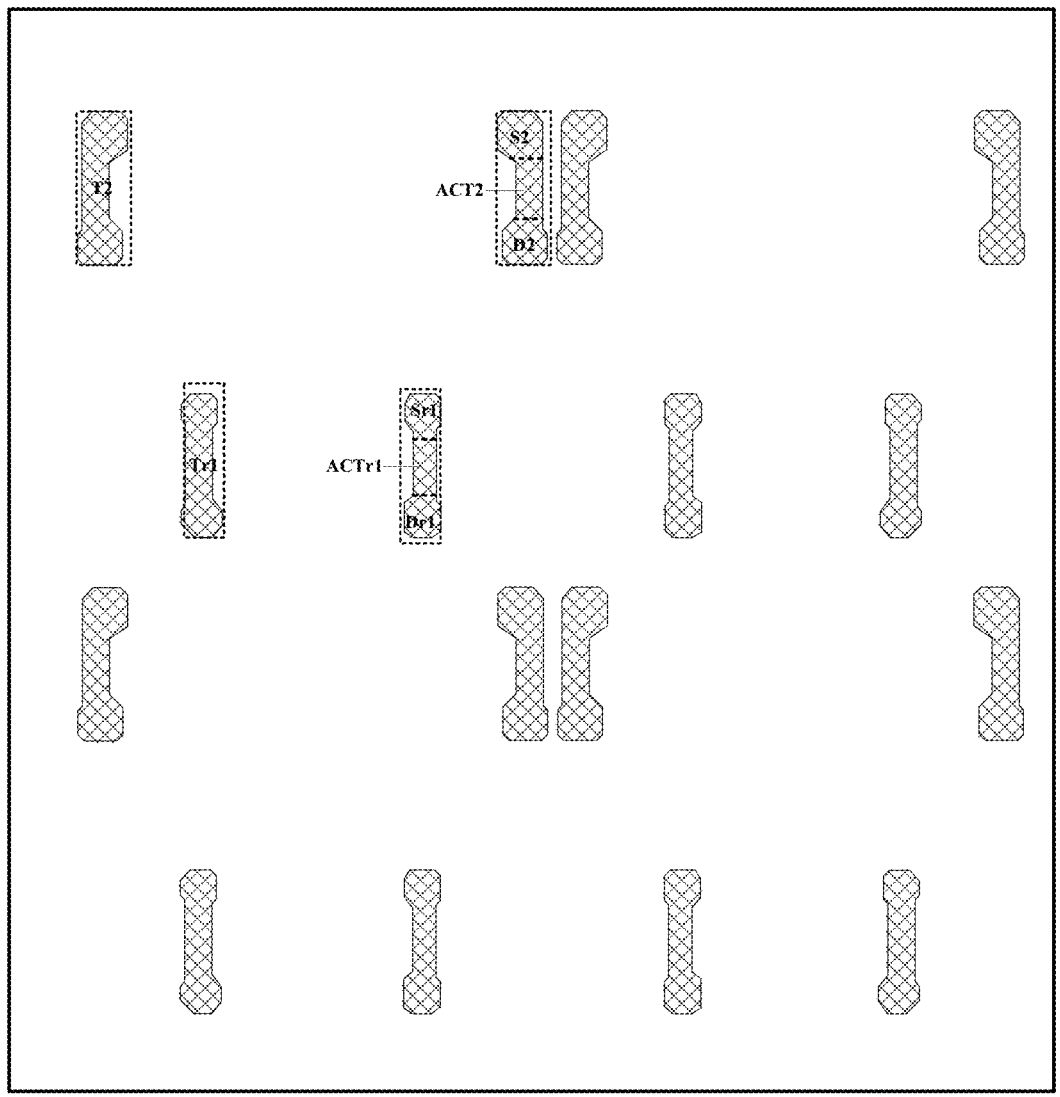
FIG. 7C is a diagram illustrating the structure of a second semiconductor material layer in the array substrate depicted in FIG. 7A.
Figure 7D:
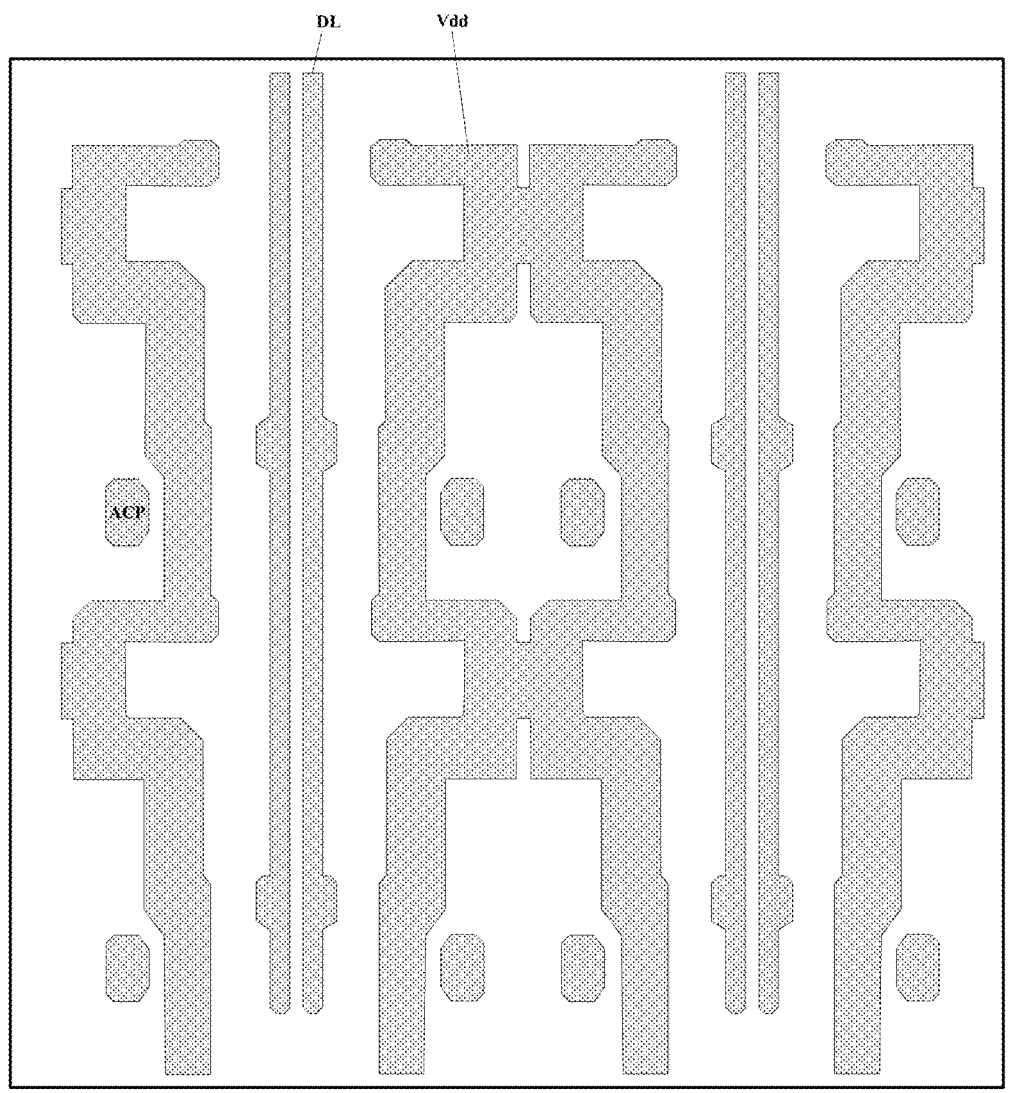
FIG. 7D is a diagram illustrating the structure of a second signal line layer in the array substrate depicted in FIG. 7A.
Figure 7E:
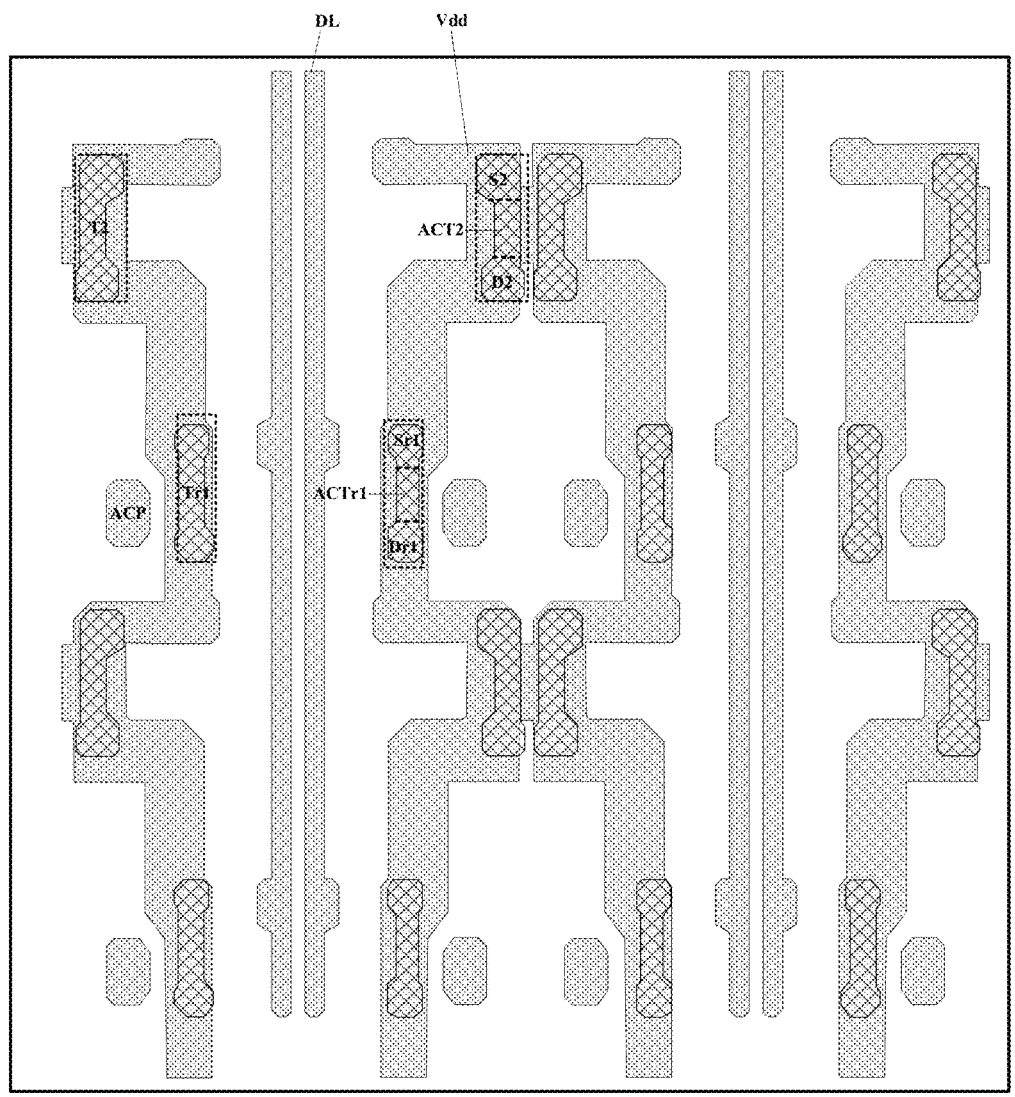
FIG. 7E is a diagram illustrating the structure of a second semiconductor material layer and a second signal line layer in the array substrate depicted in FIG. 7A.
Figure 7F:
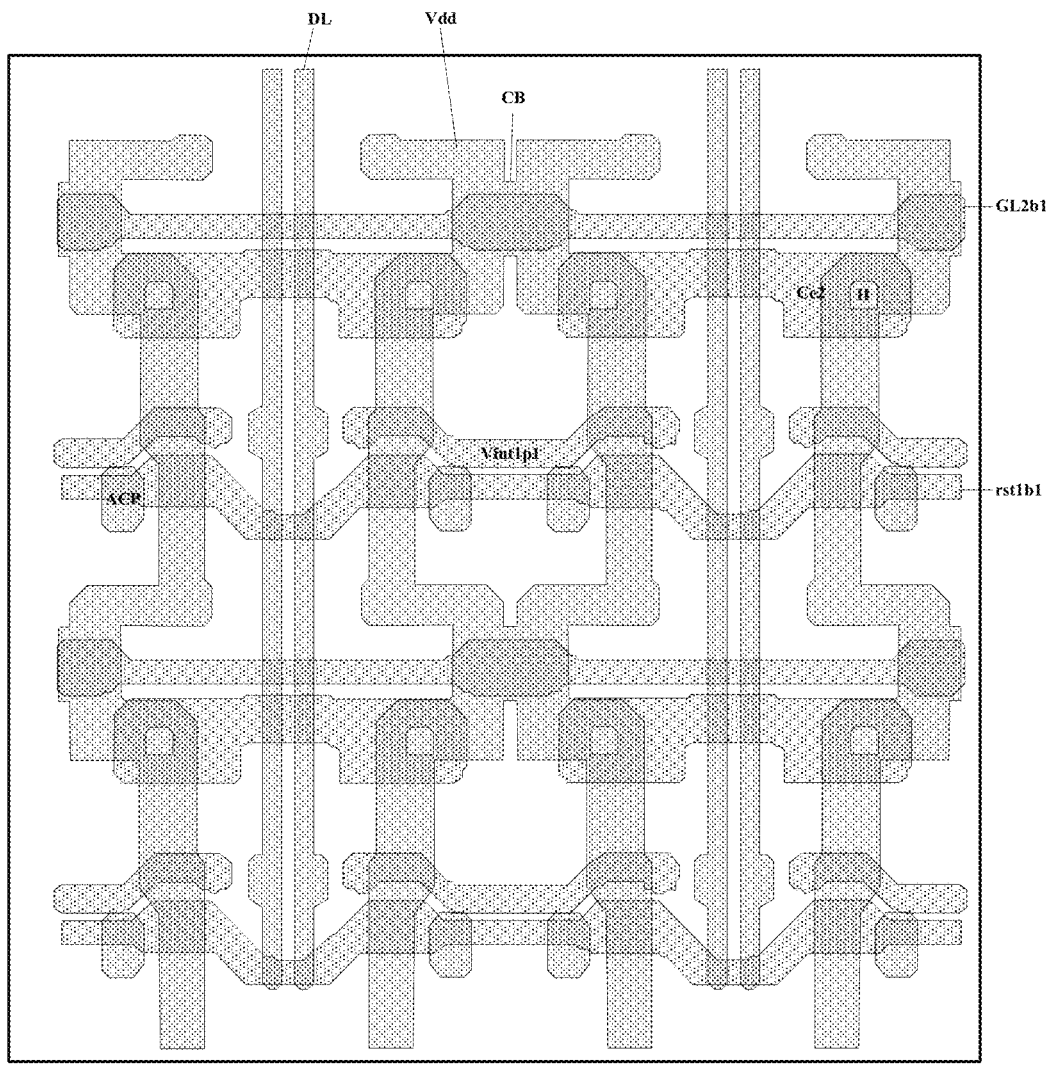
FIG. 7F is a diagram illustrating the structure of a second gate metal layer and a second signal line layer in the array substrate depicted in FIG. 7A.

FIG. 7A is a diagram illustrating the structure of pixel driving circuits in an array substrate in some embodiments according to the present disclosure. FIG. 7B is a diagram illustrating the structure of a second gate metal layer in the array substrate depicted in FIG. 7A. FIG. 7C is a diagram illustrating the structure of a second semiconductor material layer in the array substrate depicted in FIG. 7A. FIG. 7D is a diagram illustrating the structure of a second signal line layer in the array substrate depicted in FIG. 7A. FIG. 7E is a diagram illustrating the structure of a second semiconductor material layer and a second signal line layer in the array substrate depicted in FIG. 7A. FIG. 7F is a diagram illustrating the structure of a second gate metal layer and a second signal line layer in the array substrate depicted in FIG. 7A. The array substrate depicted in FIG. 7A to FIG. 7F differs from the array substrate depicted in FIG. 3A to FIG. 3N in that the structure of the plurality of voltage supply lines are different. The structures of layers other than the second signal lines layers in the array substrate depicted in FIG. 7A to FIG. 7F and the array substrate depicted in FIG. 3A to FIG. 3N are substantially the same.

As compared to the plurality of voltage supply lines in the array substrate depicted in FIG. 3A to FIG. 3N, the plurality of voltage supply lines in the array substrate depicted in FIG. 7A to FIG. 7F have a significantly reduced size, enhancing light transmittance rate of the array substrate.

Referring to FIG. 7E, even with a reduced size, an orthographic projection of the plurality of voltage supply lines on a base substrate covers an orthographic projection of at least the active layer ACT2 of the second transistor and the active layer ACTr1 of the first reset transistor on the base substrate. Optionally, the orthographic projection of the plurality of voltage supply lines on a base substrate at least partially overlaps with an orthographic projection of the first electrode S2 and the second electrode D2 of the second transistor on the base substrate. Optionally, the orthographic projection of the plurality of voltage supply lines on a base substrate at least partially overlaps with an orthographic projection of the first electrode Sr1 and the second electrode Dr1 of the first reset transistor on the base substrate.

Referring the FIG. 7F, a size of a connecting bridge CB connecting adjacent voltage supply lines of the plurality of voltage supply lines can also be minimized. In some embodiments, an orthographic projection of a combination of the connecting bridge CB and two adjacent voltage supply lines on the base substrate covers an orthographic projection of a portion of the respective second gate line first portion GL2b1 that is between gate electrodes of two second transistors respectively in two adjacent pixel driving circuits on the base substrate.

Referring to FIG. 3A to FIG. 3N, FIG. 6A to FIG. 6D, and FIG. 7A to FIG. 7F, the inventors of the present disclosure discover a novel array substrate with a novel pixel driving circuit structure, which has a significantly enhanced performance in terms of variable refresh rate. The present array substrate having the novel pixel driving circuit structure is capable of dynamically adjusting its refresh rate based on frame rates of the content input. The inventors of the present disclosure discover that, surprisingly and unexpectedly, the flicker defect can be significantly reduced as compared to related array substrates, even when switching between a wide range of frame rates.

The inventors of the present disclosure discover that it is particularly helpful in terms of variable refresh rate when at least active layers (e.g., ACT2 and ACTr1) of a compensating transistor (e.g., the second transistor T2) and a first reset transistor (e.g., the first reset transistor Tr1) are in a layer different from active layers of other transistors (e.g., the driving transistor Td). In some embodiments, at least portions of first electrodes of the compensating transistor and the first reset transistor are in the layer different from active layers of other transistors (e.g., the driving transistor Td). In some embodiments, at least portions of second electrodes of the compensating transistor and the first reset transistor are in the layer different from active layers of other transistors (e.g., the driving transistor Td). In some embodiments, active layers, at least portions of first electrodes, and at least portions of second electrodes, of the compensating transistor and the first reset transistor are in the layer different from active layers of other transistors (e.g., the driving transistor Td). In one example, the active layers, at least portions of first electrodes, and at least portions of second electrodes, of the compensating transistor and the first reset transistor are in a second semiconductor material layer, and the active layers of other transistors (e.g., the driving transistor Td) are in a first semiconductor material layer.

In some embodiments, the first electrode S2, the active layer ACT2, and the second electrode D2 are arranged along a direction substantially parallel to a direction along which the first electrode Sr1, the active layer ACTr1, and the second electrode Dr1 are arranged. The inventors of the present disclosure discover that having this layout structure is particularly conducive for achieving the high performance in terms of variable refresh rate. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Referring to FIG. 3A to FIG. 3N, FIG. 6A to FIG. 6D, and FIG. 7A to FIG. 7F, the third connecting line C13 in some embodiments crosses over multiple signal lines in different layers. In some embodiments, the third connecting line C13 crosses over at least two of the respective second reset control signal line rst2, the respective second reset signal line Vint2, the respective first gate line GL1, the respective first reset signal line Vint1 (e.g., the respective first reset signal line first portion Vint1p1), the respective first reset control signal line rst1 (e.g., at least one of the respective first reset control signal line first branch rst1b1 or the respective first reset control signal line second branch rst1b2), or the respective second light emitting control signal line EM2. Optionally, the third connecting line C13 crosses over the respective first gate line GL1, the respective first reset signal line first portion Vint1p1, the respective first reset control signal line first branch rst1b1, and the respective first reset control signal line second branch rst1b2.

In some embodiments, the respective first reset control signal line first branch rst1b 1 is in the second gate metal layer and the respective first reset control signal line second branch rst1b2 is in the third gate metal layer. The inventors of the present disclosure discover that the third connecting line C13 in this region is prone to line break because the respective first reset control signal line first branch rst1b1 and the respective first reset control signal line second branch rst1b2 are at least partially stacked on each other. The inventors of the present disclosure discover that a unique layout of the respective first reset control signal line first branch rst1b1, and the respective first reset control signal line second branch rst1b2 in this region can effectively reduce the risk of line break.

Figure 8:
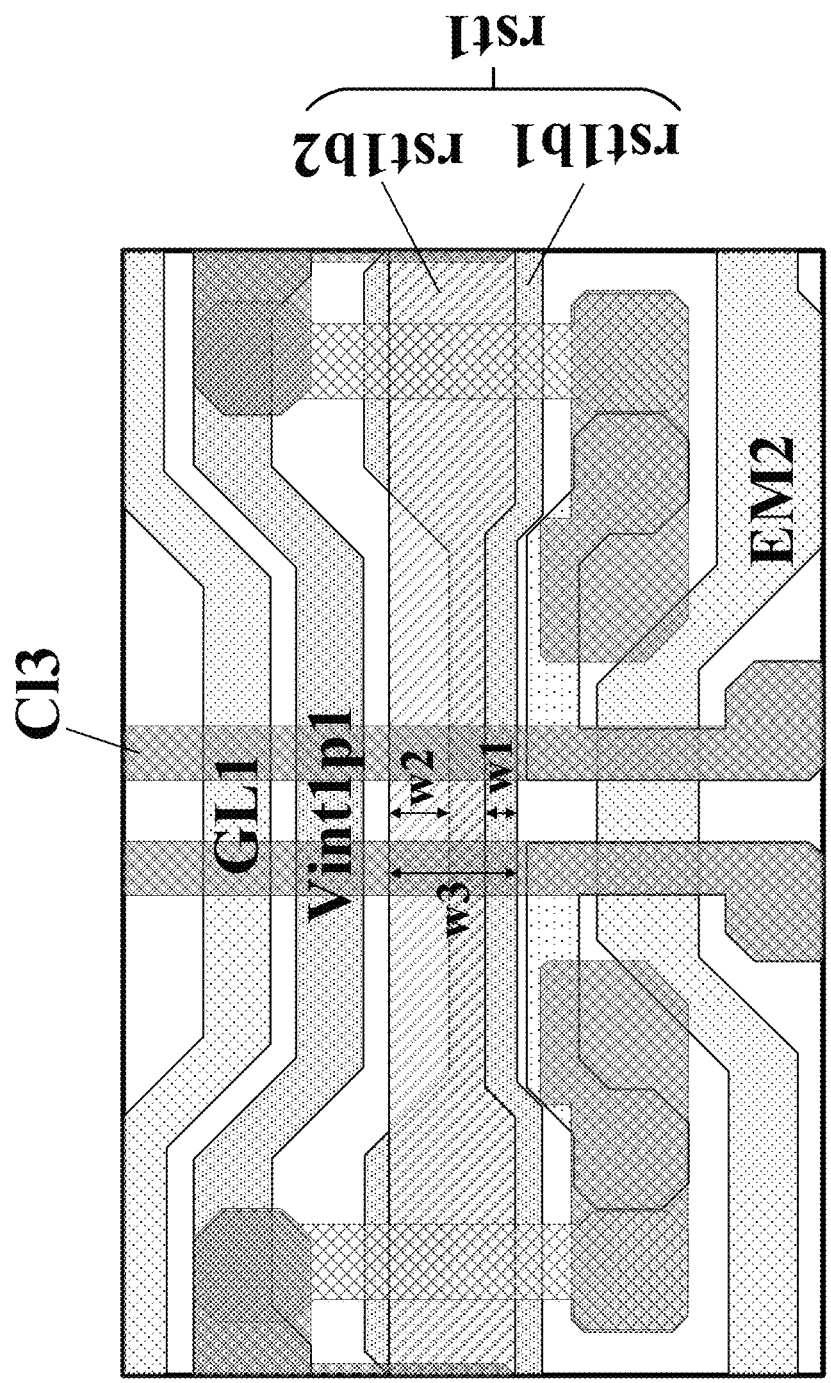
FIG. 8 is a diagram illustrating a layout of multiple signal lines in a region crossing over a third connecting line in an array substrate in some embodiments according to the present disclosure.

FIG. 8 is a diagram illustrating a layout of multiple signal lines in a region crossing over a third connecting line in an array substrate in some embodiments according to the present disclosure. Referring to FIG. 8, in a region where an orthographic projection of the third connecting line C13 on the base substrate overlaps with an orthographic projection of the respective first reset control signal line rst1 on the base substrate, an orthographic projection of the respective first reset control signal line first branch rst1b1 on the base substrate and an orthographic projection of the respective first reset control signal line second branch rst1b2 on the base substrate partially overlap with each other, and are partially non-overlapping.

In some embodiments, in the region where an orthographic projection of the third connecting line C13 on the base substrate overlaps with an orthographic projection of the respective first reset control signal line rst1 on the base substrate, a portion of the orthographic projection of the respective first reset control signal line first branch rst1b1 on the base substrate that is non-overlapping with the orthographic projection of the respective first reset control signal line second branch rst1b2 on the base substrate has a first width w1 along an extension direction of the third connecting line C13.

In some embodiments, in the region where an orthographic projection of the third connecting line C13 on the base substrate overlaps with an orthographic projection of the respective first reset control signal line rst1 on the base substrate, a portion of the orthographic projection of the respective first reset control signal line second branch rst1b2 on the base substrate that is non-overlapping with the orthographic projection of the respective first reset control signal line first branch rst1b1 on the base substrate has a second width w2 along an extension direction of the third connecting line C13.

In some embodiments, in the region where an orthographic projection of the third connecting line C13 on the base substrate overlaps with an orthographic projection of the respective first reset control signal line rst1 on the base substrate, an orthographic projection of a combination of the respective first reset control signal line first branch rst1b1 and the respective first reset control signal line second branch rst1b2 on the base substrate has a third width w3 along an extension direction of the third connecting line C13.

In some embodiments, a sum of w1 and w2 is greater than 40% (e.g., greater than 45%, greater than 50%, greater than 55%, greater than 60%, greater than 65%, greater than 70%, greater than 75%, greater than 80%, greater than 85%, or greater than 90%) of w3.

In some embodiments, w1 is greater than 10% (e.g., greater than 15%, greater than 20%, greater than 25%, greater than 30%, greater than 35%, greater than 40%, or greater than 45%) of w3.

In some embodiments, w2 is greater than 10% (e.g., greater than 15%, greater than 20%, greater than 25%, greater than 30%, greater than 35%, greater than 40%, or greater than 45%) of w3.

Optionally, w1 is in a range of 0.2 μm to 2.2 μm. In one example, w1 is approximately 1.2 μm.

Optionally, w2 is in a range of 1.3 μm to 3.3 μm. In one example, w2 is approximately 2.3 μm.

The inventors of the present disclosure discover that line break defect of the third connecting line C13 can be significantly reduced by having the layout structure according to the present disclosure.

Referring to FIG. 3A to FIG. 3N, FIG. 6A to FIG. 6D, and FIG. 7A to FIG. 7F, in some embodiments, corresponding layers of a first pixel driving circuit and corresponding layers of a second pixel driving circuit directly adjacent to each other and in the present stage (e.g., in a same row) have a substantially mirror symmetry with respect to each other, e.g., about a plane perpendicular to a main surface of the array substrate and substantially parallel to the data lines in FIG. 3A. As used herein, the term "corresponding layers of a first pixel driving circuit and corresponding layers of a second pixel driving circuit" is not intended to include layers that are not parts of the pixel driving circuits. For example, the "corresponding layers of a first pixel driving circuit and corresponding layers of a second pixel driving circuit" do not include an anode layer or a pixel definition layer. In one example, the "corresponding layers of a first pixel driving circuit and corresponding layers of a second pixel driving circuit" refers to conductive layers of the first pixel driving circuit and conductive layers of a second pixel driving circuit. In one specific example, "corresponding layers" includes at least one of a first semiconductor material layer, a first gate metal layer, a second gate metal layer, a second semiconductor material layer, a third gate metal layer, a first signal line layer, or a second signal line layer. In another specific example, "corresponding layers" further includes at least one of a gate insulating layer, an insulating layer, a first inter-layer dielectric layer, a second inter-layer dielectric layer, a passivation layer, a first planarization layer, or a second planarization layer.

Referring to FIG. 3A to FIG. 3N, FIG. 5, FIG. 4A to FIG. 4E, FIG. 6A to FIG. 6D, and FIG. 7A to FIG. 7F, to achieve a significantly enhanced performance in terms of variable refresh rate, the array substrate according to the present disclosure has a unique layout structure. In some embodiments, a respective pixel driving circuit of the plurality of pixel driving circuit includes a driving transistor Td, a compensating transistor (e.g., the second transistor T2), and a first reset transistor Tr1. Optionally, an active layer ACTd of the driving transistor Td is in a first semiconductor material layer SML1, active layers of the compensating transistor and the first reset transistor Tr1 are in a second semiconductor material layer SML2 different from the first semiconductor material layer SML1. Optionally, the array substrate includes a third connecting line C13 in a first signal line layer SD1, and connected to a second electrode of the compensating transistor.

In some embodiments, the third connecting line C13 crosses over at least two control signal lines. Optionally, the third connecting line C13 crosses over at least two of a gate line, a reset control signal line, and a light emitting control signal line. Optionally, the third connecting line C13 crosses over a gate line, a reset control signal line, and a light emitting control signal line. Optionally, the third connecting line C13 crosses over a respective first gate line; a respective first reset control signal line; a respective second reset control signal line; a respective first reset signal line; a respective second reset signal line; and a respective second light emitting control signal line.

In some embodiments, the respective pixel driving circuit further includes a second reset transistor Tr2 and a light emitting control transistor (e.g., the fourth transistor T4). Optionally, the third connecting line C13 is connected to the second electrode of the compensating transistor, a second electrode Dr2 of the second reset transistor Tr2, and a first electrode of the light emitting control transistor.

In some embodiments, the third connecting line C13 crosses over a respective second reset control signal line rst2 and a respective second reset signal line Vint2. Optionally, an orthographic projection of the respective second reset control signal line rst2 on a base substrate BS at least partially overlaps with an orthographic projection of the respective second reset signal line Vint2 on the base substrate BS.

In some embodiments, the third connecting line C13 crosses over a respective first reset control signal line rst1. Optionally, the respective first reset control signal line rst1 includes a respective first reset control signal line first branch rst1b1 and a respective first reset control signal line second branch rst1b2. Optionally, an orthographic projection of the respective first reset control signal line first branch rst1b1 on a base substrate BS at least partially overlaps with an orthographic projection of the respective first reset control signal line second branch rst1b2 on the base substrate BS.

In some embodiments, the third connecting line C13 crosses over a respective first reset signal line Vint1. Optionally, the respective first reset signal line Vint1 includes a plurality of first portions and a plurality of second portions alternately arranged and connected together. Optionally, the plurality of first portions are in a layer different from the plurality of second portions. Optionally, the third connecting line C13 crosses over a respective first reset signal line first portion Vint1p1 of the plurality of first portions in a second gate metal layer Gate2. Optionally, a respective first reset signal line second portion Vint1p2 of the plurality of second portions is in the first signal line layer SD1. Optionally, the array substrate further includes a second connecting line C12 in the first signal line layer SD1. Optionally, the respective first reset signal line second portion Vint1p2 includes a first segment, a second segment, and a third segment curving around two adjacent second connecting lines of two adjacent pixel driving circuits. Optionally, the two adjacent second connecting lines are at least partially in an area surrounded by the third segment and a virtual straight line connecting the first segment and the second segment.

In some embodiments, the active layers, at least portions of first electrodes, and at least portions of second electrodes, of the compensating transistor and the first reset transistor Tr1 are in the second semiconductor material layer. Optionally, the first electrode, the active layer, and the second electrode of the compensating transistor are arranged along a direction substantially parallel to a direction along which the first electrode, the active layer, and the second electrode of the first reset transistor are arranged.

In some embodiments, the array substrate further comprises a first connecting line Cl1 in the first signal line layer SD1. Optionally, the first connecting line Cl1 is connected to a first electrode Sd of the driving transistor Td and connected to a second electrode of a data write transistor (e.g., the first transistor T1). Optionally, the first connecting line Cl1 crosses over a respective second reset control signal line rst2 and a respective second reset signal line Vint2. Optionally, an orthographic projection of the respective second reset control signal line rst2 on a base substrate BS at least partially overlaps with an orthographic projection of the respective second reset signal line Vint2 on the base substrate BS.

In some embodiments, the array substrate further comprises a voltage connecting pad VCP and a respective voltage supply line Vdd connected to the voltage connecting pad VCP. Optionally, the voltage connecting pad VCP connects to first electrodes of third transistors of two adjacent pixel driving circuits. Optionally, two data lines of the plurality of data lines cross over the voltage connecting pad VCP.

In some embodiments, the array substrate further comprises a plurality of first light emitting control signal lines and a plurality of second light emitting control signal lines. Optionally, the respective pixel driving circuit further comprises a light emitting control transistor (e.g., the fourth transistor T4). Optionally, a first electrode of the light emitting control transistor extends in a space between a respective second light emitting control signal line EM2 of the plurality of second light emitting control signal lines and a respective first light emitting control signal line in the next row of the plurality of first light emitting control signal lines. Optionally, an orthographic projection of the first electrode of the light emitting control transistor on a base substrate BS is non-overlapping with an orthographic projection of the respective first light emitting control signal line in the next row on the base substrate and non-overlapping with an orthographic projection of the respective second light emitting control signal line EM2 on the base substrate BS.

In another aspect, the present invention provides a display apparatus, including the array substrate described herein or fabricated by a method described herein, and one or more integrated circuits connected to the array substrate.

Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present invention provides a method of fabricating an array substrate. In some embodiments, the method includes forming a plurality of pixel driving circuits. In some embodiments, forming a respective pixel driving circuit of the plurality of pixel driving circuit includes forming a driving transistor, forming a compensating transistor, and forming a first reset transistor. Optionally, an active layer of the driving transistor is formed in a first semiconductor material layer. Optionally, active layers of the compensating transistor and the first reset transistor are formed in a second semiconductor material layer different from the first semiconductor material layer. Optionally, the method further includes forming a third connecting line in a first signal line layer, and connected to a second electrode of the compensating transistor. Optionally, the third connecting line crosses over at least two control signal lines.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of pixel driving circuits;
   wherein a respective pixel driving circuit of the plurality of pixel driving circuit comprises a driving transistor, a compensating transistor, and a first reset transistor;
   wherein an active layer of the driving transistor is in a first semiconductor material layer;
   active layers of the compensating transistor and the first reset transistor are in a second semiconductor material layer different from the first semiconductor material layer;
   the array substrate comprises a third connecting line in a first signal line layer, and connected to a second electrode of the compensating transistor; and
   the third connecting line crosses over at least two control signal lines.

2. The array substrate of claim 1, wherein the third connecting line crosses over at least two control signal lines configured to transmit different types of control signals.

3. The array substrate of claim 1, wherein the third connecting line crosses over at least two of a gate line, a reset control signal line, and a light emitting control signal line.

4. The array substrate of claim 1, wherein the third connecting line crosses over a gate line, a reset control signal line, and a light emitting control signal line.

5. The array substrate of claim 1, wherein the third connecting line crosses over a respective first gate line; a respective first reset control signal line; a respective second reset control signal line; a respective first reset signal line; a respective second reset signal line; and a respective second light emitting control signal line.

6. The array substrate of claim 1, wherein the respective pixel driving circuit further comprises a second reset transistor and a light emitting control transistor; and
   the third connecting line is further connected to a second electrode of the second reset transistor and a first electrode of the light emitting control transistor.

7. The array substrate of claim 1, wherein the third connecting line crosses over a respective second reset control signal line and a respective second reset signal line; and
   an orthographic projection of the respective second reset control signal line on a base substrate at least partially overlaps with an orthographic projection of the respective second reset signal line on the base substrate.

8. The array substrate of claim 1, wherein the third connecting line crosses over a respective first reset control signal line;
   the respective first reset control signal line comprises a respective first reset control signal line first branch and a respective first reset control signal line second branch; and
   an orthographic projection of the respective first reset control signal line first branch on a base substrate at least partially overlaps with an orthographic projection of the respective first reset control signal line second branch on the base substrate.

9. The array substrate of claim 1, wherein the third connecting line crosses over a respective first reset signal line;
   the respective first reset signal line comprises a plurality of first portions and a plurality of second portions alternately arranged and connected together; and
   the plurality of first portions are in a layer different from the plurality of second portions.

10. The array substrate of claim 9, wherein the third connecting line crosses over a respective first reset signal line first portion of the plurality of first portions in a second gate metal layer.

11. The array substrate of claim 9, wherein a respective first reset signal line second portion of the plurality of second portions is in the first signal line layer;
   the array substrate further comprises a second connecting line in the first signal line layer;
   the respective first reset signal line second portion comprises a first segment, a second segment, and a third segment curving around two adjacent second connecting lines of two adjacent pixel driving circuits; and the two adjacent second connecting lines are at least partially in an area surrounded by the third segment and a virtual straight line connecting the first segment and the second segment.

12. The array substrate of claim 1, wherein the active layers, at least portions of first electrodes, and at least portions of second electrodes, of the compensating transistor and the first reset transistor are in the second semiconductor material layer; and
the first electrode, the active layer, and the second electrode of the compensating transistor are arranged along a direction substantially parallel to a direction along which the first electrode, the active layer, and the second electrode of the first reset transistor are arranged.

13. The array substrate of claim 1, further comprising a first connecting line in the first signal line layer;
wherein the first connecting line is connected to a first electrode of the driving transistor and connected to a second electrode of a data write transistor;
the first connecting line crosses over a respective second reset control signal line and a respective second reset signal line; and
an orthographic projection of the respective second reset control signal line on a base substrate at least partially overlaps with an orthographic projection of the respective second reset signal line on the base substrate.

14. The array substrate of claim 1, further comprising a voltage connecting pad and a respective voltage supply line connected to the voltage connecting pad;
wherein the voltage connecting pad connects to first electrodes of third transistors of two adjacent pixel driving circuits.

15. The array substrate of claim 14, further comprising a plurality of data lines;
wherein two data lines of the plurality of data lines cross over the voltage connecting pad.

16. The array substrate of claim 1, comprising a plurality of first light emitting control signal lines and a plurality of first light emitting control signal lines;
wherein the respective pixel driving circuit further comprises a light emitting control transistor;
a first electrode of the light emitting control transistor extends in a space between a respective second light emitting control signal line of the plurality of second light emitting control signal lines and a respective first light emitting control signal line in a next row of the plurality of first light emitting control signal lines; and
an orthographic projection of the first electrode of the light emitting control transistor on a base substrate is non-overlapping with an orthographic projection of the respective first light emitting control signal line in the next row on the base substrate and non-overlapping with an orthographic projection of the respective second light emitting control signal line on the base substrate.

17. The array substrate of claim 1, comprising a plurality of first light emitting control signal lines and a plurality of first light emitting control signal lines;
wherein the respective pixel driving circuit further comprises a light emitting control transistor;
an orthographic projection of an active layer of the light emitting control transistor on a base substrate at least partially overlaps with an orthographic projection of the third connecting line on the base substrate; and
an orthographic projection of a first electrode of the light emitting control transistor on the base substrate at least partially overlaps with the orthographic projection of the third connecting line on the base substrate.

18. The array substrate of claim 1, comprising a plurality of voltage supply lines;
wherein an orthographic projection of the plurality of voltage supply lines on a base substrate covers an orthographic projection of at least an active layer of the compensating transistor and an active layer of the first reset transistor on the base substrate;
an orthographic projection of a combination of a connecting bridge connecting two adjacent voltage supply lines of the plurality of voltage supply lines and the two adjacent voltage supply lines on a base substrate covers an orthographic projection of a portion of a respective second gate line on the base substrate, the portion of the respective second gate line being between gate electrodes of two compensating transistors respectively in two adjacent pixel driving circuits.

19. The array substrate of claim 1, comprising a plurality of first reset control signal lines;
wherein a respective first reset control signal lines of the plurality of first reset control signal lines comprises a respective first reset control signal line first branch and a respective first reset control signal line second branch;
in a region where an orthographic projection of the third connecting line on a base substrate overlaps with an orthographic projection of the respective first reset control signal line on the base substrate, an orthographic projection of the respective first reset control signal line first branch on the base substrate and an orthographic projection of the respective first reset control signal line second branch on the base substrate partially overlap with each other, and are partially non-overlapping;
in the region, a portion of the orthographic projection of the respective first reset control signal line first branch on the base substrate that is non-overlapping with the orthographic projection of the respective first reset control signal line second branch on the base substrate has a first width along an extension direction of the third connecting line;
in the region, a portion of the orthographic projection of the respective first reset control signal line second branch on the base substrate that is non-overlapping with the orthographic projection of the respective first reset control signal line first branch has a second width along an extension direction of the third connecting line;
in the region, an orthographic projection of a combination of the respective first reset control signal line first branch and the respective first reset control signal line second branch on the base substrate has a third width along the extension direction of the third connecting line; and
a sum of the first width and the second width is greater than 40% of the third width.

20. A display apparatus, comprising the array substrate of claim 1, and one or more integrated circuits connected to the array substrate.

* * * * *